(12) United States Patent
Hirosaki et al.

(10) Patent No.: US 7,713,443 B2
(45) Date of Patent: *May 11, 2010

(54) PHOSPHOR PRODUCTION METHOD

(75) Inventors: Naoto Hirosaki, Tsukuba (JP);
Rong-Jun Xie, Tsukuba (JP)

(73) Assignee: National Institute For Materials Science, Tsukuba-shi, Ibaraki (JP)

( * ) Notice: Subject to any disclaimer, the term of this patent is extended or adjusted under 35 U.S.C. 154(b) by 305 days.

This patent is subject to a terminal disclaimer.

(21) Appl. No.: 11/883,182

(22) PCT Filed: Jan. 25, 2006

(86) PCT No.: PCT/JP2006/301599

§ 371 (c)(1),
(2), (4) Date: Jul. 27, 2007

(87) PCT Pub. No.: WO2006/080539

PCT Pub. Date: Aug. 3, 2006

(65) Prior Publication Data
US 2008/0197321 A1    Aug. 21, 2008

(30) Foreign Application Priority Data
Jan. 27, 2005    (JP)    ............................ 2005-020237

(51) Int. Cl.
*C09K 11/08*    (2006.01)
(52) U.S. Cl. ................................. 252/301.4 F
(58) Field of Classification Search .......... 252/301.4 R, 252/301.4 F; 313/503, 467, 486, 582, 584; 257/98
See application file for complete search history.

(56) References Cited

U.S. PATENT DOCUMENTS 667,748 A    2/1901    Treadwell
(Continued)

FOREIGN PATENT DOCUMENTS

JP    H10-163535 A    6/1998
(Continued)

OTHER PUBLICATIONS

"Luminescence in $Eu^{2+}$-doped $Ba_2 Si_5 N_8$ : fluorescence, thermoluminescence, and upconversion" H.A.Höppe[a], H.Lutz[b], P. Morys[c], W. Schnick[a,*], A. Seilmeier[b]; Journal of Physics and chemistry of Solids 61 (2000) 2001-2006; PII: S0022-3697(00)00194-3.
(Continued)

*Primary Examiner*—C. Melissa Koslow
(74) *Attorney, Agent, or Firm*—Manuba Kanesaka

(57)    ABSTRACT

An object of the present invention is to provide an inorganic phosphor, particularly, an oxynitride phosphor containing alkaline earths which has a higher luminance than that of conventional sialon phosphors activated with a rare earth, and is chemically stable.

By baking a raw material mixture containing at least silicon nitride powder, M element containing inorganic substance, and A element containing inorganic substance at a temperature range of 1200° C. to 2200° C. in a nitrogen atmosphere, a phosphor comprising an inorganic composition containing at least M Element, A Element, silicon, oxygen, and nitrogen (wherein M Element is one or two or more elements selected from the group consisting of Mn, Ce, Pr, Nd, Sm, Eu, Tb, Dy, Ho, Er, Tm, and Yb, A Element is one or two or more elements selected from the group consisting of Mg, Ca, Sr, and Ba) and containing at least crystal having the same crystal structure as that of $A_2Si_5N_8$ and A element-containing crystal is obtained.

8 Claims, 9 Drawing Sheets

U.S. PATENT DOCUMENTS

| | | |
|---|---|---|
| 6,670,748 B2 | 12/2003 | Ellens et al. |
| 6,682,663 B2 | 1/2004 | Botty et al. |
| 6,724,142 B2 | 4/2004 | Ellens et al. |
| 7,414,272 B2 * | 8/2008 | Hiramatsu et al. ............ 257/99 |
| 7,540,977 B2 * | 6/2009 | Hirosaki et al. ....... 252/301.4 F |
| 2005/0200271 A1 * | 9/2005 | Juestel et al. ............... 313/503 |

FOREIGN PATENT DOCUMENTS

| | | |
|---|---|---|
| JP | 2900928 | 3/1999 |
| JP | 2927279 | 5/1999 |
| JP | 2002-363554 A | 12/2002 |
| JP | 2003-277746 A | 10/2003 |
| JP | 2003-321675 A | 11/2003 |
| JP | 2004-10786 A | 1/2004 |

OTHER PUBLICATIONS

"On new rare-earth doped M-Si-Al-O-N materials, Luminescence properties and oxidation resistance", Joost Willem Hendrik van Krevel, subject headings: silicon nitride oxide; sialon/luminescence/lanthanide; Ce, Eu, Tb/oxidation resistance 2000, pp. 1-75.

* cited by examiner

PHOSPHOR PRODUCTION METHOD

TECHNICAL FIELD

The present invention relates to a phosphor production method.

BACKGROUND ART

Phosphors are used for a vacuum fluorescent display (VFD), a field emission display (FED or SED), a plasma display panel (PDP), a cathode ray tube (CRT), a white light-emitting diode (LED), and the like. In all these applications, it is necessary to provide energy for exciting the phosphors in order to cause emission from the phosphors. The phosphors are excited by an excitation source having a high energy, such as a vacuum ultraviolet ray, an ultraviolet ray, an electron beam, or a blue light to emit a visible light.

However, as a result of exposure of the phosphors to the above excitation source, there arises a problem of decrease of luminance of the phosphors due to a long term use and hence a phosphor exhibiting no decrease of luminance has been desired. Therefore, a sialon phosphor has been proposed as a phosphor exhibiting little decrease of luminance instead of conventional silicate phosphors, phosphate phosphors, aluminate phosphors, sulfide phosphors, and the like.

The sialon phosphor is produced by the production process outlined below. First, silicon nitride ($Si_3N_4$), aluminum nitride (AlN), calcium carbonate ($CaCO_3$), and europium oxide ($Eu_2O_3$) are mixed in a predetermined molar ratio and the mixture is held at 1700° C. for 1 hour in nitrogen at 1 atmosphere (0.1 MPa) and is baked by a hot pressing process to produce the phosphor (See e.g., Patent Document 1).

The α-sialon activated with Eu ion obtained by the process is reported to be a phosphor which is excited by a blue light of 450 to 500 nm to emit a yellow light of 550 to 600 nm. However, in the applications of a white LED and a plasma display using an ultraviolet LED as an excitation source, phosphors emitting lights exhibiting not only yellow color but also orange color and red color have been desired. Moreover, in a white LED using a blue LED as an excitation source, phosphors emitting lights exhibiting orange color and red color have been desired in order to improve color-rendering properties.

As a phosphor emitting a light of red color, an inorganic substance ($Ba_{2-x}Eu_xSi_5N_8$: x=0.14 to 1.16) obtained by activating a $Ba_2Si_5N_8$ crystal with Eu has been reported in an academic literature before application of the present invention (See, e.g., Non-Patent Document 1).

Furthermore, in Chapter 2 of an academic literature "On new rare-earth doped M-Si—Al—O—N materials" (see, e.g., Non-Patent Document 2), a phosphor using a ternary nitride of an alkali metal and silicon having various compositions, $M_xSi_yN_z$ (M=Ca, Sr, Ba, Zn; x, y, and z represent various values) as a host has been reported.

Similarly, $M_xSi_yN_z$:Eu (M=Ca, Sr, Ba, Zn; z=2/3x+4/3y) has been reported in Patent Document 2.

As another sialon, nitride or oxynitride phosphors, in Patent Documents 3 and 4 phosphors using $MSi_3N_5$, $M_2Si_4N_7$, $M_4Si_6N_{11}$, $M_9Si_{11}N_{23}$, $M_{16}Si_{15}O_6N_{32}$, $M_{13}Si_{18}Al_{12}O_{18}N_{36}$, $MSi_5Al_2ON_9$, and $M_3Si_5AlON_{10}$ (wherein M represents Ba, Ca, Sr or a rare earth element) as host crystals, which are activated with Eu or Ce, have been described. Among them, phosphors emitting a light of red color have been also reported. Moreover, LED lighting units using these phosphors are known.

Among them, there are known $SrSiAl_2O_3N_2$:$Eu^{2+}$ and $Sr_2Si_4AlON_7$:$Eu^{2+}$ as $Eu_aSr_bSi_cAl_dO_eN_f$-based chemical compounds. Furthermore, Patent Document 5 has described a phosphor wherein an $Sr_2Si_5N_8$ or $SrSi_7N_{10}$ crystal is activated with Ce.

Furthermore in Patent Document 6, there is a description of $LxMyN_{(2/3x+4/3y)}$:Z (L is a divalent element such as Ca, Sr, or Ba, M is a tetravalent element such as Si or Ge, Z is an activator such as Eu) phosphor and it describes that addition of a minute amount of Al exhibits an effect of suppressing afterglow. Moreover, a slightly reddish warm color white emitting apparatus is known, wherein the phosphor and a blue LED are combined.

Furthermore, Patent Document 7 describes phosphors constituted by various combinations of L Element, M Element, and Z Element as $LxMyN_{(2/3x+4/3y)}$:Z phosphors. Patent Document 8 describes a wide range of combinations regarding an L-M-N:Eu,Z system but there is not shown an effect of improving emission properties in the cases where a specific composition or crystal phase is used as a host.

In the representative phosphors in Patent Documents 2 to 8 mentioned above, phosphors using various different crystal phases as host crystals have been reported. The phosphors emitting a light of red color are also known but emitting luminance of red color is not sufficient by excitation with a blue visible light. Moreover, they are chemically unstable in some composition and thus their durability is problematic. Further, metal or nitride such as Ca or Sr is used as a starting material, so that it is necessary to mix powders in an outside air cutoff state, thus posing a problem in terms of productivity.

REFERENCES

Non-Patent Document 1: H. A. Hoppe, and other four persons, "Journal of Physics and Chemistry of Solids" 2000, vol. 61, pages 2001-2006

Non-Patent Document 2: "On new rare-earth doped M-Si—Al—O—N materials" written by J. W. H. van Krevel, T U Eindhoven 2000, ISBN 90-386-2711-4

Patent Document 1: JP-A-2002-363554

Patent Document 2: U.S. Pat. No. 6,682,663

Patent Document 3: JP-A-2003-206481

Patent Document 4: U.S. Pat. No. 667-748

Patent Document 5: JP-A-2002-322474

Patent Document 6: JP-A-2003-321675

Patent Document 7: JP-A-2003-277746

Patent Document 8: JP-A-2004-10786

As conventional art of lighting apparatus, a white light-emitting diode in which a blue light-emitting diode element and a blue-absorbing yellow light-emitting phosphor are combined is known and has been practically used in various lighting applications. Representative examples thereof include "a light-emitting diode" of Patent Document 9, "a light-emitting diode" of Patent Document 10, "a wavelength-converting molding material and a process for producing the same, and a light-emitting element" of Patent Document 11, and the like. Phosphors most frequently used in these light-emitting diodes are yttrium aluminum garnet-based phosphors activated with cerium represented by the general formula:

$(Y,Gd)_3(Al,Ga)_5O_{12}$:$Ce^{3+}$.

However, there is a problem that the white light-emitting diode comprising a blue light-emitting diode element and the yttrium aluminum garnet-based phosphor has a characteristic of emitting a bluish-white light because of an insufficient red component and hence deflection is found in color-rendering properties.

Based on such a background, there has been investigated a white light-emitting diode in which a red component which is short in the yttrium aluminum garnet-based phosphor is supplemented with another red phosphor by mixing and dispersing the two kinds of phosphors. As such light-emitting diodes, "a white light-emitting diode" of Patent Document 12, "a nitride phosphor and a process for producing the same" of Patent Document 6, and the like can be exemplified.

However, a problem to be improved regarding color-rendering properties still remains also in these inventions, and hence it is desired to develop a light-emitting diode where the problem is solved. The red phosphor described in Patent Document 12 contains cadmium and thus there is a problem of environmental pollution. Although red light emitting phosphors including $Ca_{1.97}Si_5N_8:Eu_{0.03}$ described in Patent Document 6 as a representative example do not contain cadmium but further improvement of its emission intensity has been desired since luminance of the phosphor is low.

REFERENCES

Patent Document 8: Japanese Patent No. 2900928
Patent Document 9: Japanese Patent No. 2927279
Patent Document 10: Japanese Patent No. 3364229
Patent Document 11: JP-A-10-163535

DISCLOSURE OF INVENTION

Problems to be Solved by the Invention

The present invention intends to reply such demands and an object thereof is to provide an inorganic phosphor, particularly, an oxynitride phosphor containing alkaline earths which has a higher luminance than that of a conventional sialon phosphor activated with a rare earth, and is chemically stable and provide its production method suitable for industrial scale production in which a starting material which is stable in an atmosphere is used. Furthermore, another object of the present invention is to provide a lighting apparatus excellent in color-rendering properties in which such a phosphor is used and a light-emitting apparatus for an image display unit excellent in durability.

Means for Solving the Problem

Under such circumstances, the present inventors have conducted precise studies on phosphors using as a host an inorganic multi-element nitride crystal containing divalent alkaline-earth element (A), such as Mg, Ca, Sr, and Ba and Si as main metal elements and have found that a phosphor using an inorganic crystal containing two phases of a crystal having the same crystal structure as $A_2Si_5N_8$ and A element-containing crystal (esp. $A_2SiO_4$) as a host, which is activated with optically-active metal such as Mn, Ce, Nd, Sm, Eu, Tb, Dy, Ho, Er, Tm, and Yb, can undergo powder mixture in an atmosphere and emits a higher luminance than that of phosphors hitherto reported containing a nitride or oxynitride as a host crystal.

Furthermore, they have found that, among the above compositions, a use of a phosphor emitting red light achieves an image display unit that emits white light-emitting diode which has a high emission efficiency, is rich in a red component, and exhibits good color-rendering properties or emits red light having an especially high luminance.

The host crystal of the phosphor of the present invention exhibits an unprecedented luminance by using an inorganic crystal containing two phases of $A_2Si_5N_8$-$A_2SiO_4$ system as a host, quite unlike a phosphor comprising a single phase of ternary nitrides of divalent and tetravalent elements represented by $L_xM_yN_{(2/3x+4/3y)}$ hitherto reported. Moreover, the phosphor of the present invention is a novel phosphor using a crystal having a composition and crystal structure quite different from the sialons such as $M_{13}Si_{18}Al_{12}O_{18}N_{36}$, $MSi_5Al_2ON_9$, $M_3Si_5AlON_{10}$ (wherein M represents Ca, Ba, Sr, or the like), $SrSiAl_2O_3N_2:Eu^{2+}$, and $Sr_2Si_4AlON_7:Eu^{2+}$ hitherto reported in Patent Document 3 and the like and $Ca_{1.47}Eu_{0.03}Si_9Al_3N_{16}$ described in Chapter 11 of Non-Patent Document 2 as a host.

In general, a phosphor in which an inorganic host crystal is activated with Mn or a rare earth metal as an emission center element M changes an emitting color and luminance depending on an electron state around M Element. For example, in a phosphor containing divalent Eu as the emission center, light emission of blue color, green color, yellow color, or red color has been reported by changing the host crystal. Namely, even in the case that the composition is resembled, when the crystal structure of the host or the atom position in the crystal structure to which M is incorporated is changed, the emitting color and luminance become quite different and thus the resulting phosphor is regarded as a different one.

A phosphor of the present invention uses as a host a crystal quite different from that of conventional nitride or oxynitride phosphors and that of sialon composition. There has not been reported a phosphor having such a crystal as a host. In addition, the phosphor containing the composition of the present invention as a host exhibits a luminance higher than that of those containing a conventional crystal as a host, and exhibits a red light emission in the cases where a specific composition is used as a host.

As a result of further extensive studies based on the above findings, the inventors have succeeded in providing a phosphor showing an emission phenomenon with a high luminance in a specific wavelength region by the constitutions described in the following (1) to (22). Moreover, they have also succeeded in providing a phosphor having excellent light emission characteristics using methods described in the following (23) to (37). Moreover, they have also succeeded in providing a lighting apparatus and an image display unit having excellent characteristics by the constitutions described in the following (38) to (47) by using the phosphor. The constitutions are as described in the following (1) to (47).

(1) A phosphor characterized in that
the phosphor is an inorganic composition containing at least M Element, A Element, silicon, oxygen, and nitrogen (wherein M Element is one or two or more elements selected from the group consisting of Mn, Ce, Pr, Nd, Sm, Eu, Tb, Dy, Ho, Er, Tm, and Yb, A Element is one or two or more elements selected from the group consisting of Mg, Ca, Sr, and Ba) which has at least a crystal having the same crystal structure as that of $A_2Si_5N_8$ and an A element-containing crystal.

(2) The phosphor according to (1), characterized in that an inorganic crystal having the same crystal structure as that of $A_2Si_5N_8$ is $A_2Si_5N_8$ or its solid solution crystal.

(3) The phosphor according to any one of (1) and (2), characterized in that an inorganic crystal having the same crystal structure as that of $A_2Si_5N_8$ is solid solution crystal of $A_2Si_5N_8$ containing oxygen.

(4) The phosphor according to any one of (1) to (3), characterized in that an inorganic crystal having the same crystal structure as that of $A_2Si_5N_8$ is solid solution crystal of $A_2Si_5N_8$ containing A element and oxygen.

(5) The phosphor according to any one of (1) to (4), characterized in that an inorganic crystal having the same crystal structure as that of $A_2Si_5N_8$ is $A_{2-z}Si_5O_zN_{8-z}$ (0<z<1).

(6) The phosphor according to any one of (1) to (5), characterized in that A element containing crystal is crystal containing at least A, Si, and O.

(7) The phosphor according to any one of (1) to (6), characterized in that A element containing crystal is $A_2SiO_4$ or its solid solution crystal.

(8) The phosphor according to any one of (1) to (7), characterized in that an inorganic crystal having the same crystal structure as that of $A_2Si_5N_8$ is not less than 20% by weight but not more than 80% by weight, and A element containing crystal is not less than 20% by weight but not more than 80% by weight.

(9) The phosphor according to any one of (1) to (6), characterized in that the content of $A_2Si_5N_8$ relative to $A_2SiO_4$ ($A_2Si_5N_8/A_2SiO_4$) is not less than 0.8 but not more than 3 by mol based.

(10) The phosphor according to any one of (1) to (9), characterized in that the ratio between M, A, Si, O, and N constituting inorganic composition is represented by the composition formula $M_aA_bSi_cO_dN_e$ (wherein a+b+c+d+e=1) and satisfies all the following conditions:

$$0.00001 \leq a \leq 0.03 \quad (1)$$

$$0.14 \leq b \leq 0.22 \quad (2)$$

$$0.22 \leq c \leq 0.32 \quad (3)$$

$$0.14 \leq d \leq 0.22 \quad (4)$$

$$0.28 \leq e \leq 0.44 \quad (5).$$

(11) The phosphor according to any one of (1) to (10), characterized in that inorganic composition is represented by the composition formula $M_yA_{2-y}Si_3O_2N_4$ ($0.0001 \leq y \leq 0.3$).

(12) The phosphor according to any one of (1) to (11), characterized in that A element is Sr.

(13) The phosphor according to any one of (1) to (11), characterized in that A element is Ba.

(14) The phosphor according to any one of (1) to (13), characterized in that at least Eu is contained as M element.

(15) The phosphor according to any one of (1) to (14), characterized in that the phosphor is a composition comprising at least Eu, Sr, Si, oxygen, and nitrogen which has $Sr_2Si_5N_8$ or its solid solution crystal and $Sr_2SiO_4$ or its solid solution crystal.

(16) The phosphor according to (15), characterized in that $Sr_2Si_5N_8$ or its solid solution crystal is $Sr_{2-z}Si_5O_zN_{8-z}$ (0<z<1), $Sr_2SiO_4$ or its solid solution crystal is a mixture of $\alpha$-$Sr_2SiO_4$ and $\beta$-$Sr_2SiO_4$, and the content of $Sr_{2-z}Si_5O_zN_{8-z}$ relative to ($\alpha$-$Sr_2SiO_4$+$\beta$-$Sr_2SiO_4$) ($Sr_{2-z}Si_5O_zN_{8-z}$/($\alpha$-$Sr_2SiO_4$+$\beta$-$Sr_2SiO_4$)) is not less than 0.8 but not more than 3 by mol based.

(17) The phosphor according to any one of (1) to (16), characterized in that the phosphor emits an orange or red light having a wavelength of 570 nm to 700 nm by irradiation with an excitation source of either an ultraviolet ray, a visible light, or an electron beam.

(18) The phosphor according to any one of (1) to (17), characterized in that in a phosphor emission spectrum obtained by irradiation with an excitation source of either an ultraviolet ray, a visible light, or an electron beam, the maximum value of the emission peak at a wavelength of 450 nm to 550 nm is ⅕ or less the emission peak at a wavelength of 570 nm to 700 nm.

(19) A phosphor characterized in that the phosphor is constituted by a mixture of the inorganic compound according to (1) to (18) and other crystal phase or amorphous phase, and the content of the inorganic compound according to (1) to (18) is 10% by weight or more.

(20) The phosphor according to (19), characterized in that the content of the inorganic compound according to (1) to (18) is 50% by weight or more.

(21) The phosphor according to any one of (19) and (20), characterized in that other crystal phase or amorphous phase is an inorganic substance having electroconductivity.

(22) The phosphor according to (21), characterized in that the inorganic substance having electroconductivity is a material comprising an oxide, oxynitride, or nitride containing one or two or more elements selected from the group consisting of Zn, Ga, In, and Sn, or a mixture thereof.

(23) A production method of the phosphor according to any one of (1) to (22) characterized in that a raw material mixture of at least silicon nitride powder, M element containing inorganic substance, and A element containing inorganic substance is baked at a temperature range of 1200° C. to 2200° C. in a nitrogen atmosphere.

(24) The phosphor production method according to (23), characterized in that M containing inorganic substance is a mixture of one or two or more compounds selected from the group consisting of metal, silicide, oxide, carbonate, nitride, fluoride, and chloride or oxynitride of M element, and A containing inorganic substance is a mixture of one or two or more compounds selected from the group consisting of metal, silicide, oxide, carbonate, nitride, fluoride, and chloride or oxynitride of A element.

(25) The phosphor production method according to any one of (23) and (24), characterized in that M containing inorganic substance is oxide of M element, and A containing inorganic substance is oxide of A element.

(26) The phosphor production method according to any one of (22) to (25), characterized in that a raw material powder obtained by mixing silicon nitride, oxide of M element, and A containing inorganic substance (wherein oxide of M element is on $M_2O_3$ basis, A containing inorganic material is on AO basis) in a mixing ratio represented by $fSi_3N_4$–$gM_2O_3$–$hAO$ (wherein f+g+h=1), in which $$0.00001 \leq g \leq 0.03 \quad (6)$$

$$0.4 \leq h \leq 0.8 \quad (7)$$

is satisfied is used as a staring material.

(27) The phosphor production method according to any one of (23) to (26), characterized in that a flux compound for generating liquid phase is added to a raw material mixture at a baking temperature.

(28) The phosphor production method according to (27), characterized in that a flux compound is a compound selected from the group consisting of boron oxide, boron nitride, boric acid, fluoride, chloride, and borate of A element.

(29) The phosphor production method according to any one of (23) to (28), characterized in that the pressure of nitrogen atmosphere is in the range of from 0.1 MPa to 100 MPa.

(30) The phosphor production method according to any one of (23) to (29), characterized in that a raw material mixture in the form of powder or powder aggregate is filled in a vessel with the relative bulk density maintained at 40% or less before baking.

(31) The phosphor production method according to (30), characterized in that a vessel is made of boron nitride.

(32) The phosphor production method according to any one of (23) to (31), characterized in that the sintering is not carried out by hot press, but exclusively by pressureless sintering or gas pressure sintering.

(33) The phosphor production method according to any one of (23) to (32), characterized in that the average particle size of synthesized phosphor powder is controlled to 50 nm to 50 μm by one or more methods selected from pulverization, classification, and acidizing.

(34) The phosphor production method according to any one of (23) to (33), characterized in that the phosphor power after baking, phosphor powder after pulverization, or phosphor powder after particle size control is subjected to heat treatment at a temperature of not less than 1000° C. but not more than a baking temperature.

(35) The phosphor production method according to any one of (23) to (34), characterized in that a resultant product obtained after baking is washed by water or acid aqueous solvent so as to reduce the contained amount of a glass phase, second phase, flux component phase, or impurity phase.

(36) The phosphor production method according to (35), characterized in that acid contains one element selected from the group consisting of sulfuric acid, hydrochloric acid, nitric acid, hydrofluoric acid, and organic acid or a mixture thereof.

(37) The phosphor production method according to any one of (35) and (36), characterized in that acid is a mixture of hydrofluoric acid and sulfuric acid.

(38) A lighting apparatus constituted by at least a light-emitting source and a phosphor, characterized in that the lighting apparatus uses at least the phosphor according to any one of (1) to (22).

(39) The lighting apparatus according to (38), characterized in that the light-emitting source is an LED, a laser diode, or organic EL light-emitting element which emits a light having a wavelength of 330 nm to 500 nm.

(40) The lighting apparatus according to any one of (38) and (39), characterized in that the light-emitting source is an LED emitting a light having a wavelength of 330 nm to 420 nm and the lighting apparatus emits a white light or mixed color light by mixing red, green, and blue light using the phosphor according to any one of (1) to (22), a blue phosphor emitting a light having a wavelength of 420 nm to 500 nm with an excitation light of 330 nm to 420 nm, and a green phosphor emitting a light having a wavelength of 500 nm to 570 nm with an excitation light of 330 nm to 420 nm.

(41) The lighting apparatus according to any one of (38) and (39), characterized in that the light-emitting source is an LED emitting a light having a wavelength of 420 nm to 500 nm and the lighting apparatus emits a white light or mixed color light using the phosphor according to any one of (1) to (22) and a green phosphor emitting a light having a wavelength of 500 nm to 570 nm with an excitation light of 420 nm to 500 nm.

(42) The lighting apparatus according to any one of (38) and (39), characterized in that the light-emitting source is an LED emitting a light having a wavelength of 420 nm to 500 nm and the lighting apparatus emits a white light or mixed color light using the phosphor according to any one of (1) to (22) and a yellow phosphor emitting a light having a wavelength of 550 nm to 600 nm with an excitation light of 420 nm to 500 nm.

(43) The lighting apparatus according to (42), characterized in that the yellow phosphor is Ca-α sialon in which Eu is dissolved.

(44) The lighting apparatus according to any one of (40) and (41), characterized in that the green phosphor is β-sialon in which Eu is dissolved.

(45) An image display unit constituted by at least an excitation source and a phosphor, characterized in that the image display unit uses at least the phosphor according to any one of (1) to (22).

(46) The image display unit according to (45), characterized in that an excitation source is an electron beam, electric field, vacuum ultraviolet ray or ultraviolet ray.

(47) The image display unit according to any one of (45) and (46), characterized in that an image display unit is any of a vacuum fluorescent display (VFD), a field emission display (FED or SED), a plasma display panel (PDP), and a cathode-ray tube (CRT).

Advantage of the Invention

The phosphor of the present invention contains as a main component an inorganic compound containing divalent alkaline-earth element A, Si, nitrogen, and oxygen and containing as a host crystal a crystal composed of two or more phases of an inorganic crystal having the same crystal stricture as that of $A_2Si_5N_8$ and A element-containing crystal (esp. $A_2SiO_4$), in which M-element is dissolved, thereby exhibits light emission at a longer wavelength than that in the cases of conventional sialon and oxynitride phosphors, so that the phosphor of the invention is regarded as high luminance phosphor. The above composition can be synthesized using Si3N4, MO (oxide of M), AO (oxide of A), or $ACO_3$ (carbonate of A) which is stable in the air as a starting material and therefore excellent in productivity. Further, the phosphor of the present invention is chemically stable. Thus, even when exposed to an excitation source, the phosphor does not exhibit decrease of luminance and thus provides a useful phosphor which is suitably employed in VFD, FED, PDP, CRT, white LED, and the like.

EXPLANATION OF REFERENCE SYMBOLS

Figure 1:
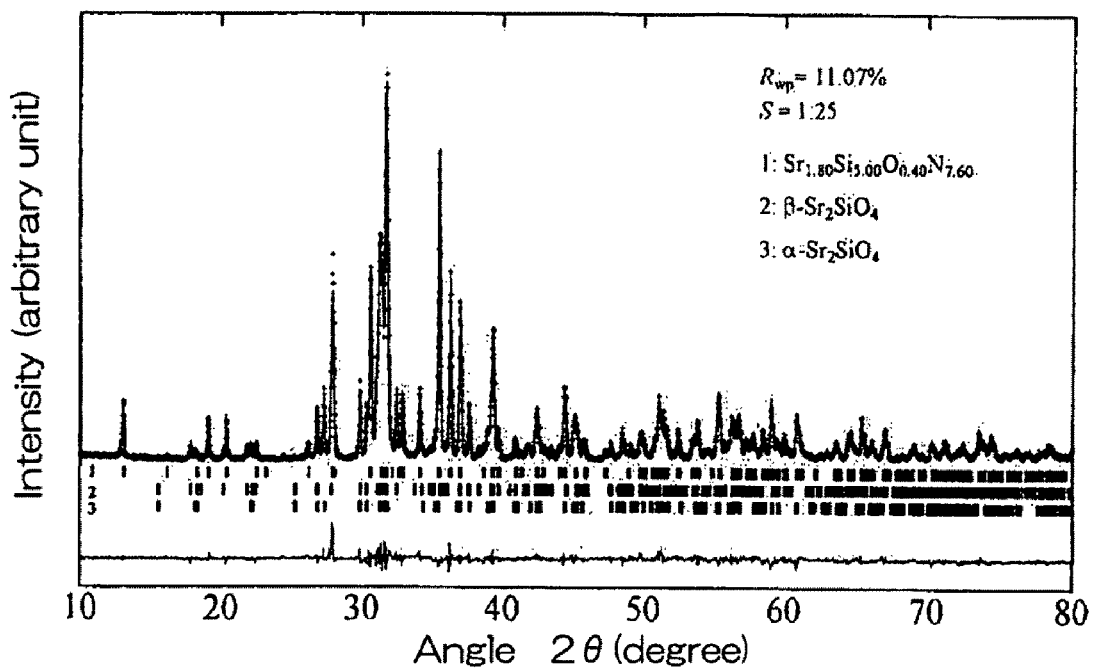
FIG. 1 is an X-ray diffraction chart of crystal (Example 1)

1: Bullet-type LED lamp
2, 3: Lead wire
4: LED element
5: Bonding wire
6, 8: Resin
7: Phosphor
11: Chip-type white LED lamp for mounting on substrate
12, 13: Lead wire
14: LED element
15: Bonding wire
16, 18: Resin
17: Phosphor
19: Alumina ceramics substrate
20: Side surface member
31: Red phosphor
32: Green phosphor
33: Blue phosphor
34, 35, 36: Ultraviolet ray-emitting cell
37, 38, 39, 40: Electrode
41, 42: Dielectric layer
43: Protective layer
44, 45: Glass substrate

BEST MODE FOR CARRYING OUT THE INVENTION

In the following, the present invention will be described in detail.

The phosphor of the present invention is a composition containing at least active element M, divalent alkaline-earth element A, silicon, nitrogen, and oxygen. M Element is one or two or more elements selected from the group consisting of Mn, Ce, Pr, Nd, Sm, Eu, Gd, Tb, Dy, Ho, Er, Tm, and Yb, A Element is one or two or more elements selected from the group consisting of Mg, Ca, Sr, and Ba. The phosphor of the present invention is composed of the above elements and at least contains inorganic crystal having the same crystal stricture as that of $A_2Si_5N_8$ and A element-containing crystal.

As the inorganic element having the same crystal structure as $A_2Si_5N_8$, $Mg_2Si_5N_8$, $Ca_2Si_5N_8$, $Sr_2Si_5N_8$, $Ba_2Si_5N_8$ and their solid solution crystals can be exemplified. Further, the inorganic crystal may contain mixed composition of two or more A elements such as $Ca_{1-x}Sr_xSi_5N_8$ or $Sr_{1-x}Ba_xSi_5N_8$ (0<x<1). Among them, a composition containing $Ca_2Si_5N_8$ and $Sr_2Si_5N_8$ crystal and their solid solution crystals is favorable because of its higher luminance in red color.

As the solid solution crystal, the following compounds can be taken as an example: (1) one in which part of A of $A_2Si_5N_8$ is replaced with divalent element, (2) one in which part of Si is replaced with Al and part of N is replaced with oxygen so that the charge neutrality is maintained as a whole, (3) one in which part of A is replaced with univalent element and part of N is replaced with oxygen so that the charge neutrality is maintained as a whole and (4) one in which part of A is replaced with univalent element and trivalent or more element so that the charge neutrality is maintained as a whole. The above compounds have the same crystal structure as that of $A_2Si_5N_8$.

The solid solution crystal of $A_2Si_5N_8$ that contains oxygen has an emission wavelength which is shifted to the shorter wavelength side, so that it is suitable for application requiring emission of orange or yellow light. Especially, crystal represented by $A_{2-z}Si_5O_zN_{8-z}$ (0<z<1) is favorable because it exhibits high-luminance short-wavelength light emission characteristics. Oxygen is replaced in the atom position of N in the crystal and, at the same time, part of A element is lost and vacancy is formed for compensating a charge. Further, z-value represents the solid solution amount of oxygen, and within the range of the z-value, the solid solution is formed.

A element containing crystal is an inorganic crystal containing A element other than an inorganic crystal having the same structure as that of $A_2Si_5N_8$ and is mainly silicate such as $ASiO_3$, $A_2SiO_4$, and $A_3SiO_5$. Further, oxynitride in which nitrogen is included in these silicate may be included in the A element containing crystal. Especially, $A_2SiO_4$ is favorable because of its higher emission luminance.

It is preferable that the content of the inorganic crystal phase having the same crystal structure as that of $A_2Si_5N_8$ is in the range of from 20% by weight to 80% by weight, and content of the A element containing crystal is in the range of from 20% by weight to 80% by weight. When the content falls outside the above range, emission luminance becomes decreased. The inorganic composition in which the content of $A_2Si_5N_8$ relative to $A_2SiO_4$ ($A_2Si_5N_8/A_2SiO_4$) is not less than 0.8 but not more than 3 by mol based, especially, inorganic composition in which the content of $A_2Si_5N_8$ relative to $A_2SiO_4$ ($A_2Si_5N_8/A_2SiO_4$) is 1 by mol based exhibits a high luminance. The content of these crystal phases can be determined from the results of multiphase analysis using the Rietveld method which employs X-ray diffraction. More simply, it is possible to determine the content of these crystal phases from the ratio of the intensity of the strongest peaks in respective phases of the two crystal phases through the measurement of X-ray diffraction.

Among the inorganic composition of the present invention, one in which the ratio between M, A, Si, O, and N constituting the inorganic composition is represented by the composition formula $M_aA_bSi_cO_dN_e$ (wherein a+b+c+d+e=1), and the following conditions are satisfied exhibits a higher luminance:

$$0.00001 \leq a \leq 0.03 \tag{1}$$

$$0.14 \leq b \leq 0.22 \tag{2}$$

$$0.22 \leq c \leq 0.32 \tag{3}$$

$$0.14 \leq d \leq 0.22 \tag{4}$$

$$0.28 \leq e \leq 0.44 \tag{5}$$

Especially, composition represented by $M_yA_{2-y}Si_3O_2N_4$ (0.0001≦y≦0.3) is favorable because of its higher emission luminance.

A element of the present invention is one or two or more elements selected from the group consisting of Mg, Ca, Sr, and Ba. Among them, Sr and Ba show particularly a high luminance. The above elements emit different color from each other, so that selection may be made depending on the application.

M element of the present invention is one or two or more elements selected from the group consisting of Mn, Ce, Pr, Nd, Sm, Eu, Gd, Tb, Dy, Ho, Er, Tm, and Yb. Among them, Eu shows red emission with good color purity.

The phosphor of the present invention emits an orange or red light having a wavelength of 570 nm to 700 nm by irradiation with an excitation source of either an ultraviolet ray, a visible light, or an electron beam. The phosphor which is a composition containing at least Eu, Sr, Si, oxygen, nitrogen, and contains $Sr_2Si_5N_8$ or its solid solution crystal and $Sr_2SiO_4$ or its solid solution crystal exhibits a high luminance red color emission of 610 nm to 640 nm. Especially, the phosphor whose entire composition is represented by $Eu_ySr_{2-y}Si_3O_2N_4$ ($0.001 \leq y \leq 0.05$) shows particularly a high luminance.

The phosphor of the present invention is a composition containing a crystal having the same crystal structure as that of $A_2Si_5N_8$ and A element containing crystal, and its light emission mechanism can be considered as follows. As one embodiment of the present invention, a composition represented by $Sr_{2-y}Si_3O_2N_4$:$Eu^{2+}$ containing $Sr_2Si_5N_8$ solid solution and $Sr_2SiO_4$ is disclosed. $Sr_2Si_5N_8$:$Eu^{2+}$ functions as a red phosphor by itself. $Sr_2SiO_4$:$Eu^{2+}$ functions as a green phosphor by itself. In the present invention, these crystal phases are mixed to thereby increase the emission luminance. $Sr_2Si_5N_8$:$Eu^{2+}$ can be directly excited by a excitation source as well as by absorbing a green light emitted from the excited $Sr_2SiO_4$:$Eu^{2+}$, so that $Sr_2Si_5N_8$:$Eu^{2+}$ can effectively emit a red light. As a result, light emission intensity is low at the wavelength from 450 nm to 550 nm (blue or green light component) in an emission spectrum of the present invention, and the maximum value of the emission peak at the above range is ⅕ or less the emission peak at a wavelength of 570 nm to 700 nm (orange or red light component). Thus, even in the case where two phases are mixed together, the phosphor emitting high luminance orange or red light can be obtained.

Among the composition containing $Sr_2Si_5N_8$ solid solution and $Sr_2SiO_4$, a phosphor in which $Sr_2Si_5N_8$ or its solid solution crystal is $Sr_{2-z}Si_5O_zN_{8-z}$ ($0<z<1$), $Sr_2SiO_4$ or its solid solution crystal is a mixture of $\alpha$-$Sr_2SiO_4$ and $\beta$-$Sr_2SiO_4$, and the content of $Sr_{2-z}Si_5O_zN_{8-z}$ relative to ($\alpha$-$Sr_2SiO_4$+$\beta$-$Sr_2SiO_4$) ($Sr_{2-z}Si_5O_zN_{8-z}/(\alpha$-$Sr_2SiO_4$+$\beta$-$Sr_2SiO_4$)) is not less than 0.8 but not more than 3 by mol based shows particularly a high luminance.

In the case where the phosphor is used as a powder, the average particle size is preferably from 0.1 μm to 50 μm in view of dispersibility into the resin and fluidity of the powder. Moreover, emission luminance is further improved by using single crystal particles having an average particle size of 0.1 μm to 50 μm.

In order to obtain a phosphor exhibiting a high emission luminance, the amount of impurities contained in the inorganic compound is preferably as small as possible. In particular, since the contamination of a large amount of Fe, Co, and Ni impurity elements inhibits light emission, it is suitable that raw powders are selected and the synthetic steps are controlled so that the total of these elements becomes not more than 500 ppm.

In the present invention, from the viewpoint of fluorescence emission, it is desirable that the inorganic composition containing a crystal having the same crystal structure as $A_2Si_5N_8$ constituting the oxynitride and A element containing crystal be contained in high purity and as much as possible, and the inorganic composition is possibly composed of a single phase but it may be composed of a mixture thereof with the other crystal phases or an amorphous phase within the range where the characteristics do not decrease. In this case, it is desirable that the content of the inorganic composition is 10% by weight or more in order to obtain a high luminance. Further preferably, when the content is 50% by weight or more, luminance is remarkably improved. In the present invention, the range as a main component is a content of the inorganic composition of at least 10% by weight or more. The content of the inorganic composition can be determined from the results of multiphase analysis using the Rietveld method which employs X-ray diffraction. More simply, it is possible to determine the content of the inorganic composition from the ratio of the intensity of the strongest peaks in respective phases of the inorganic composition crystal and the other crystal through the measurement of X-ray diffraction.

In the case where the phosphor of the present invention is used for applications excited with an electron beam, electroconductivity can be imparted to the phosphor by mixing it with an inorganic substance having electroconductivity. As the inorganic substance having electroconductivity, there may be mentioned oxides, oxynitrides, or nitrides containing one or two or more elements selected from the group consisting of Zn, Al, Ga, In, and Sn, or mixtures thereof.

In the case where mixing with the other colors such as yellow color, green color, and blue color is necessary, it is possible to mix inorganic phosphors emitting lights of these colors according to necessity.

The phosphors of the present invention obtained as above are characterized in that they have a wide excitation range of from an electron beam or an X-ray and an ultraviolet ray to a visible light, emit an orange to red light of 570 nm or longer, and particularly exhibit red color of 600 nm to 650 nm at a specific composition, and they exhibit a red light ranging from 0.44 to 0.73 in terms of the value of (x, y) on CIE chromaticity coordinates as compared with conventional oxide phosphors and existing sialon phophors. Owing to the above emission characteristics, they are suitable for a lighting apparatus and an image display unit. In addition, since they are not degraded even when exposed to a high temperature, they are excellent in heat resistance and also excellent in long-term stability under an oxidizing atmosphere and under a moist environment.

The phosphors of the present invention do not limit the production process but a phosphor exhibiting a high luminance can be produced by the following process.

A high-luminance phosphor is obtained by baking a raw material mixture, which is a mixture of at least silicon nitride power, M element-containing inorganic material and A element-containing inorganic material and may constitute a composition represented by M, A, Si, O, N, by baking the mixture, at a temperature range of 1200° C. to 2200° C. in an inert atmosphere containing nitrogen.

M containing inorganic substance is a mixture of one or two or more compounds selected from the group consisting of metal, silicide, oxide, carbonate, nitride, fluoride, and chloride or oxynitride of M element. Among them, oxide of M is favorable because of easy handling. Further, elements other than M and oxygen do not remain in a reacted product, whereby a phosphor emitting a light with a high luminance can be obtained.

A containing inorganic substance is a mixture of one or two or more compounds selected from the group consisting of metal, silicide, oxide, carbonate, nitride, fluoride, and chloride or oxynitride of A element. Among them, oxide of A is favorable because of easy handling. Further, elements other than A and oxygen do not remain in a reacted product, whereby a phosphor emitting a light with a high luminance can be obtained.

The following production method is a method that can obtain a phosphor exhibiting particularly a high emission luminance. Silicon nitride powder, oxide of M ($M_2O_3$), and oxide of A (AO) are used as a starting material powder and they are mixed in a mixing ratio represented by fSi$_3$N$_4$–gM$_2$O$_3$–hAO (wherein f+g+h=1), in which $$0.00001 \leq g \leq 0.03 \quad (6)$$

$$0.4 \leq h \leq 0.8 \quad (7)$$

is satisfied, followed by baking. Since this starting material is stable in the air, the above production method is advantageous in that weighing, mixing, and drying of powder can be carried out in the atmosphere.

When an inorganic compound for generating liquid phase is added to a mixture of the starting material at a baking temperature and baking is carried out, liquid phase is generated at a high temperature and functions as a flux to accelerate crystal formation of the phosphor to thereby improve crystallization of the phosphor to enhance emission luminance.

As an inorganic compound serving as a flux, there may be mentioned boron oxide, boron nitride, boric acid, fluoride, chloride, and borate of A element.

Next, a phosphor is synthesized by baking the resulting mixture of the metal compounds in a temperature range of 1200° C. to 2200° C. in an inert atmosphere containing nitrogen. Since the baking is conducted at a high temperature and the baking atmosphere is an inert atmosphere containing nitrogen, the furnace for use in the baking is a metal-resistor resistive heating type one or a graphite resistive heating type one and an electric furnace using carbon as a material for a high-temperature part of the furnace is suitable. As the method of the baking, a sintering method of applying no mechanical pressure externally, such as a pressureless sintering method or a gas pressure sintering method is preferred since baking is conducted while the bulk density is maintained at high level.

The pressure of the nitrogen atmosphere is preferably not less than 0.1 MPa but not more than 100 MPa. When the pressure of the nitrogen atmosphere becomes less than 0.1 MPa, silicon nitride undergoes heat decomposition during the baking process. On the other hand, the pressure of more than 100 MPa is not favorable from the view point of industrial production.

It is appropriate that the above mixed powder is baked in a state where bulk density is maintained to 40% or less. The bulk density means a volume filling rate of the powder and can be determined according to (ratio between the mass of the powder when the powder is filled in a vessel and volume of the vessel)/(theoretical density of metal compound). As a vessel, a boron nitride sintered article is suitable because of low reactivity with the metal compounds.

The reason why the powder is baked in a state where bulk density is maintained to 40% or less is that baking in the state that a free space is present around the raw powder enables synthesis of a crystal phase having little surface defect since a reaction product grows in a free space and hence the contact of the crystal phases themselves decreases.

In the case where the powder aggregate obtained by the baking is strongly adhered, it is pulverized by means of a pulverizing machine usually used industrially, such as a ball mill or a jet mill. The pulverization is conducted until the average particle size reaches 50 μm or less. Particularly preferred is an average particle size of 0.1 μm to 5 μm. When the average particle size exceeds 50 μm, fluidity of the powder and dispersibility thereof into resins become worse and emission intensity becomes uneven from part to part at the time when a light-emitting apparatus is formed in combination with a light-emitting element. When the size becomes 0.1 μm or less, the amount of defects on the surface of a phosphor powder becomes large and hence emission intensity decreases in some phosphor compositions.

When a phosphor powder after baking, phosphor powder after pulverization, or phosphor powder after particle size control is subjected to heat treatment at a temperature of not less than 1000° C. but not more than a baking temperature, the number of defects which have been introduced on the surface at the pulverization time is reduced to enhance luminance.

When a product is obtained after baking is washed by water or acid aqueous solvent, the contained amount of a glass phase, second phase, flux component phase, or impurity phase can be reduced resulting in an increase in luminance. In this case, as the acid, there may be mentioned one element selected from the group consisting of sulfuric acid, hydrochloric acid, nitric acid, hydrofluoric acid, and organic acid or a mixture thereof. Especially, a mixture of hydrofluoric acid and sulfuric acid exhibits a high impurity removal effect.

As explained in the above, the phosphor of the present invention exhibits a higher luminance than that of conventional sialon phosphors and, since decrease in luminance of the phosphor is small when it is exposed to an excitation source, it is a phosphor suitable for VFD, FED, PDP, CRT, white LED, and the like.

The lighting apparatus of the present invention is constituted by the use of at least a light-emitting source and the phosphor of the present invention. As the lighting apparatus, there may be mentioned an LED lighting apparatus, a fluorescent lamp, and the like. The LED lighting apparatus can be produced by known methods as described in JP-A-5-152609, JP-A-7-99345, Japanese Patent No. 2927279, and so forth with the phosphor of the present invention. In this case, the light-emitting source is desirably one emitting a light having a wavelength of 330 to 500 nm, and particularly preferred is an ultraviolet (or violet) LED light-emitting element of 330 to 420 nm or a blue LED light-emitting element of 420 to 500 nm.

As these light-emitting elements, there exist an element comprising a nitride semiconductor such as GaN or InGaN and, by adjusting the composition, it may be employed as a light-emitting source which emits a light having a predetermined wavelength.

In the lighting apparatus, in addition to the method of using the phosphor of the present invention solely, by the combined use thereof with a phosphor having other emission characteristics, a lighting apparatus emitting a desired color can be constituted. As one example, there is a combination of an ultraviolet LED light-emitting element of 330 to 420 nm with a blue phosphor excited at the wavelength and having an emission peak at a wavelength of 420 nm to 480 nm, a green phosphor excited at the wavelength of 330 to 420 nm and having an emission peak at a wavelength of 500 nm to 550 nm, and the phosphor of the present invention. There may be mentioned BaMgAl$_{10}$O$_{17}$:Eu as the blue phosphor and BaMgAl$_{10}$O$_{17}$:Eu,Mn as the green phosphor. In this constitution, when the phosphors are irradiated with an ultraviolet ray emitted by the LED, three lights having red, green, and blue lights are emitted and a white lighting apparatus is formed by mixing the lights.

As an alternative method, there is a combination of a blue LED light-emitting element of 420 to 500 nm with a yellow phosphor excited at the wavelength and having an emission peak at a wavelength of 550 nm to 600 nm and the phosphor of the present invention. As such a yellow phosphor, there may be mentioned (Y,Gd)$_2$ (Al,Ga)$_5$O$_{12}$:Ce described in Japanese Patent No. 2927279 and α-sialon:Eu described in JP-A-2002-363554. Of these, a Ca-α-sialon in which Eu is dissolved is preferred owing to high emission luminance. In this constitution, when the phosphors are irradiated with a blue light emitted by the LED, two lights having red and yellow colors are emitted and the lights are mixed with the blue light of LED itself to form a lighting apparatus exhibiting a white color or a reddish lamp color.

As another method, there is a combination of a blue LED light-emitting element of 420 to 500 nm with a green phosphor excited at the wavelength and having an emission peak at a wavelength of 500 nm to 570 nm and the phosphor of the invention. As such a green phosphor, there may be mentioned $Y_2Al_5O_{12}$:Ce, or β-sialon:Eu. In this constitution, when the phosphors are irradiated with a blue light emitted by the LED, two lights having red and green colors are emitted and the lights are mixed with the blue light of LED itself to form a white lighting apparatus.

The image display unit of the present invention is constituted by at least an excitation source and the phosphor of the present invention and includes a vacuum fluorescent display (VFD), a field emission display (FED or SED), a plasma display panel (PDP), a cathode ray tube (CRT), and the like. The phosphor of the present invention is confirmed to emit a light by excitation with a vacuum ultraviolet ray of 100 to 190 nm, an ultraviolet ray of 190 to 380 nm, an electron beam, or the like. Thus, by the combination of any of these excitation sources and the phosphor of the present invention, the image display unit as above can be constituted.

EXAMPLES

The following will describe the present invention further in detail with reference to the following Examples but they are disclosed only for the purpose of easy understanding of the present invention and the invention is not limited to these Examples.

Example 1

In order to synthesize a compound represented by the composition formula: $Eu_{0.0036364}Sr_{0.178182}i_{0.272727}O_{0.181818}N_{0.363636}$ ($Sr_{2-y}Si_3O_2N_4$:$Eu_y^{2+}$, y=0.04), the silicon nitride powder having an average particle size of 0.5 μm, an oxygen content of 0.93% by weight, and an α-type content of 92%, the strontium oxide powder, and the europium oxide powder, were weighed so as to be 40.03% by weight, 57.96% by weight, and 2.01% by weight, respectively, followed by mixing with hexane added planetary ball mill using balls and pot of silicon nitride and drying with a rotary evaporator. The resultant mixture was pulverized using a pestle and mortar and mortar made of silicon nitride and allowed to fall freely into a crucible made of boron nitride having a diameter of 20 mm and a height of 20 mm through a sieve of 500 μm to fill the crucible with the powder. The filling bulk density of the powder was about 25%. The bulk density was calculated based on the weight of the placed powder aggregate and inner volume of the crucible.

The crucible in which the mixed powder was placed was set in a graphite resistive heating-type electric furnace. The baking operations were conducted as follows: the baking atmosphere was first vacuumed by a diffusion pump, heated from room temperature to 800° C. at a rate of 500° C. per hour, and pressurized to 1 MPa by introducing nitrogen having a purity of 99.999% by volume at 800° C., and the temperature was elevated to 1600° C. at a rate of 500° C. per hour and held at 1600° C. for 2 hours. The obtained product maintained its filling state of the powder and a dense portion was not founded.

After baking, the resulting baked product was roughly pulverized and then was pulverized by hand using a crucible and mortar made of silicon nitride sintered compact, followed by filtering through a sieve having a mesh of 30 μm. When the particle distribution was measured, the average particle size was found to be 10 μm.

Next, the synthesized compound was pulverized by means of an agate mortar and then measurement of powder X-ray diffraction was conducted using Kα line of Cu. As a result, the resulting chart is shown in FIG. 1, and unreacted $Si_3N_4$ or SrO was not found. As a result of the analysis, the substance represented by the X-ray diffraction of FIG. 1 was confirmed to be constituted by the following three phases (1) $Sr_{1.8}Si_5O_{0.4}N_{7.6}$ (solid solution having the same crystal structure as $Sr_2Si_5N_8$) (2) α-type $Sr_2SiO_4$ (3) β-type $Sr_2SiO_4$. The contents of the respective phases were 0.64, 0.16, 0.20 (mass ratio). $Sr_{1.8}Si_5O_{0.4}N_{7.6}$ is crystal in which part of N of $Sr_2Si_5N_8$ crystal was replaced with O and part of Sr is lost and vacancy was formed.

The uniformity of the particle size was observed by an SEM provided with a cathode luminescence (CL) detector and a cathode luminescence image (CL image) was evaluated. This apparatus is configured to detect a visible light generated by irradiation of an electron beam to acquire a photo image as a two-dimensional image to thereby determine where which wavelength of a light is emitting.

Figure 2:
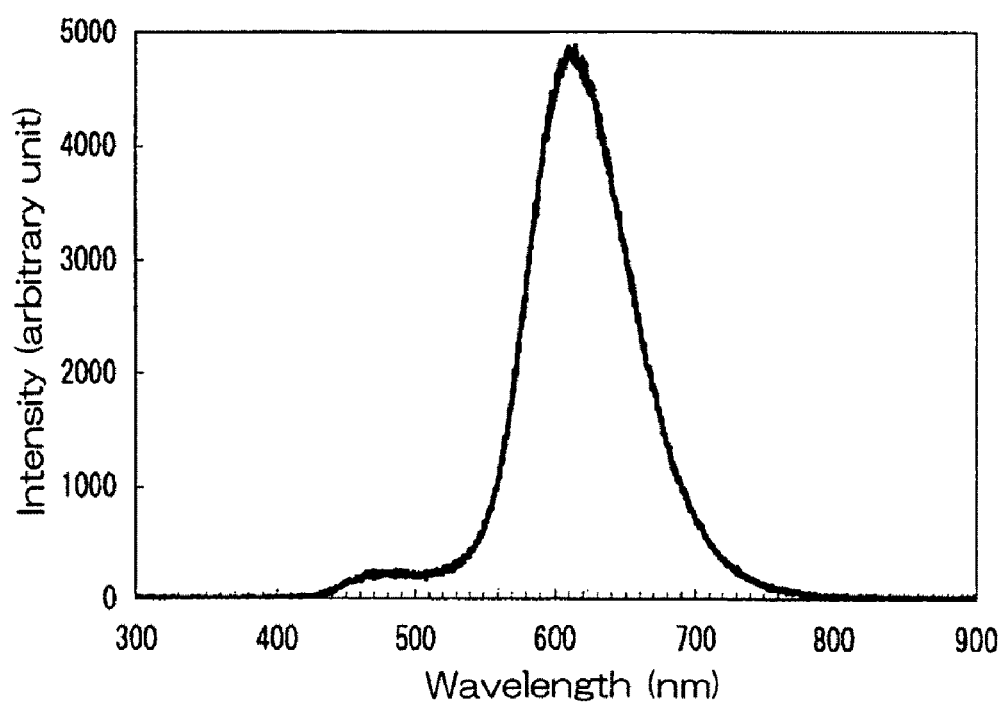
FIG. 2 is view showing an emission spectrum of a phosphor (Example 1) excited with an electron beam.

FIG. 2 shows an emission spectrum of the entire image excited by an electron beam having an acceleration voltage of 5 kV. This phosphor was excited by an electron beam and exhibits weak emission at 400 to 520 nm (maximum value=200 counts) and exhibits emission of a red light having a peak at 620 nm (maximum value=4800 counts).

Figure 3:
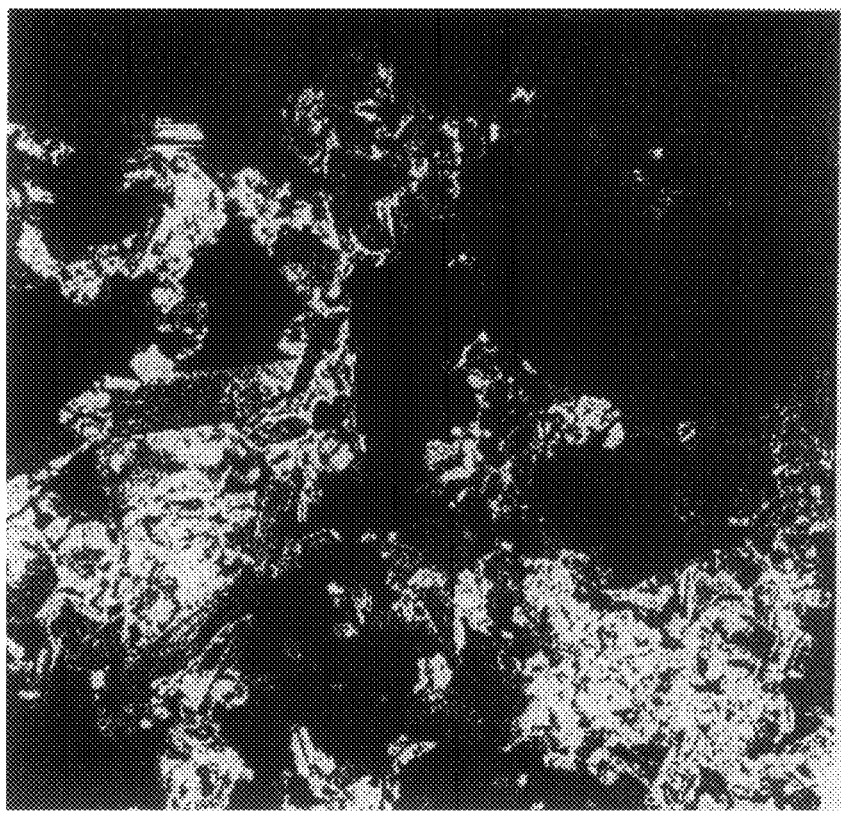
FIG. 3 is a view showing an emission form of a phosphor (Example 1)

It was confirmed from a CL image (FIG. 3) observed through a spectrometer of 620 nm, the phosphor was constituted by a particle emitting red light and particle that does not emit red light. The white portion in the CL image is a portion emitting a light of 620 nm and black portion is a portion that does not emit a light of this wavelength. Further, the stronger the white color in the gray-scale image is, the stronger the red light becomes. The particle emitting red light is a solid solution ($Sr_{1.8}Si_5O_{0.4}N_{7.6}$) having the same crystal structure of $Sr_2Si_5N_8$ and particle that does not emit red light is $Sr_2SiO_4$.

Figure 4:
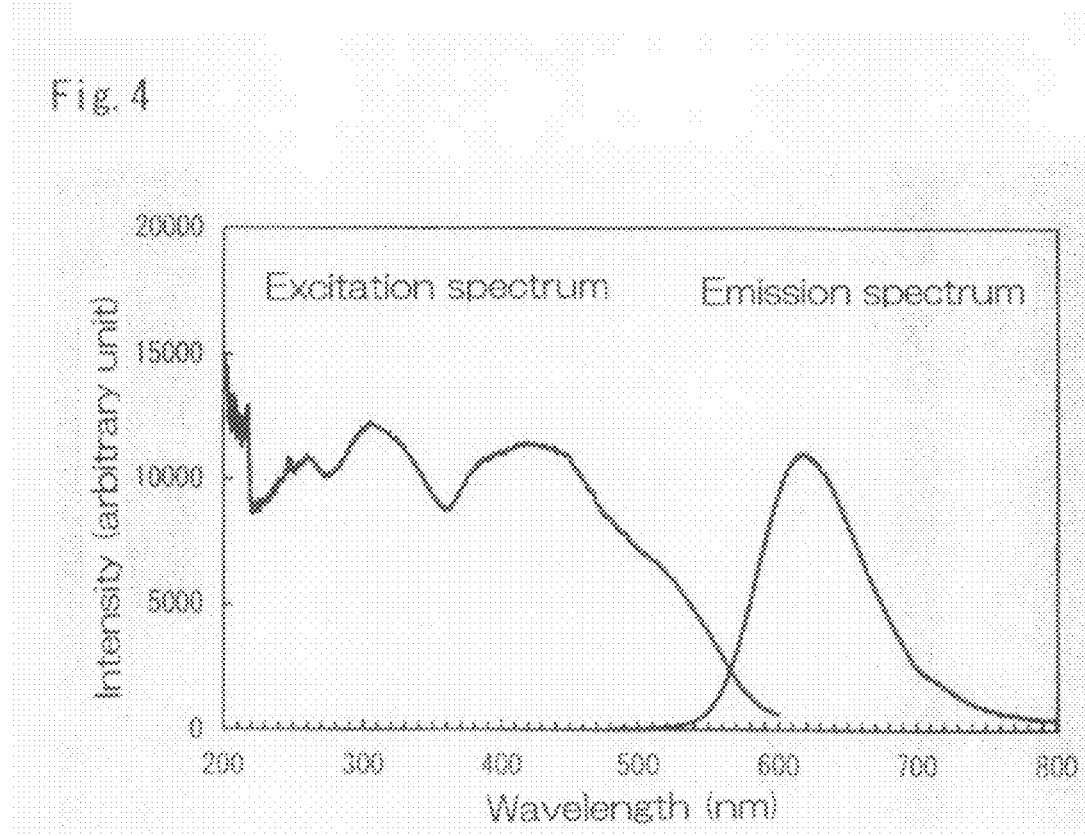
FIG. 4 is a view showing emission and excited spectra of a phosphor (Example 1)

As a result of irradiation of the powder with a lamp emitting a light having a wavelength of 365 nm, emission of a red light was confirmed. As a result of measurement of emission spectrum and excitation spectrum (FIG. 4) of the powder using a fluorescence spectrophotometer, it was found that the peak of the excitation spectrum was present at 420 nm and it was a phosphor having a peak at a red light of 618 nm in the emission spectrum with excitation at 420 nm. The emission intensity of the peak was 11000 counts. In this connection, since the count value varies depending on the measuring apparatus and conditions, the unit is an arbitrary unit. Moreover, the CIE chromaticity determined from the emission spectrum with excitation at 450 nm was red color of x=0.62 and y=0.38.

Example 2

In order to synthesize a compound represented by the composition formula: $Eu_{0.0030769}Sr_{0.227692}Si_{0.230769}O_{0.230769}N_{0.307692}$ ($Sr_{3-y}Si_3O_3N_4$:$Eu_y^{2+}$, y=0.04), the silicon nitride powder having an average particle size of 0.5 μm, an oxygen content of 0.93% by weight, and an α-type content of 92%, the strontium oxide powder, and the europium oxide powder, were weighed so as to be 30.89% by weight, 67.56% by weight, and 1.55% by weight, respectively, followed by mixing, drying, and baking in a manner similar to the Example 1. After baking, the resulting baked product was roughly pulverized and then was pulverized by hand using a crucible and mortar made of silicon nitride sintered compact, followed by filtering through a sieve having a mesh of 30 µm. When the particle distribution was measured, the average particle size was found to be 8 µm.

Figure 5:
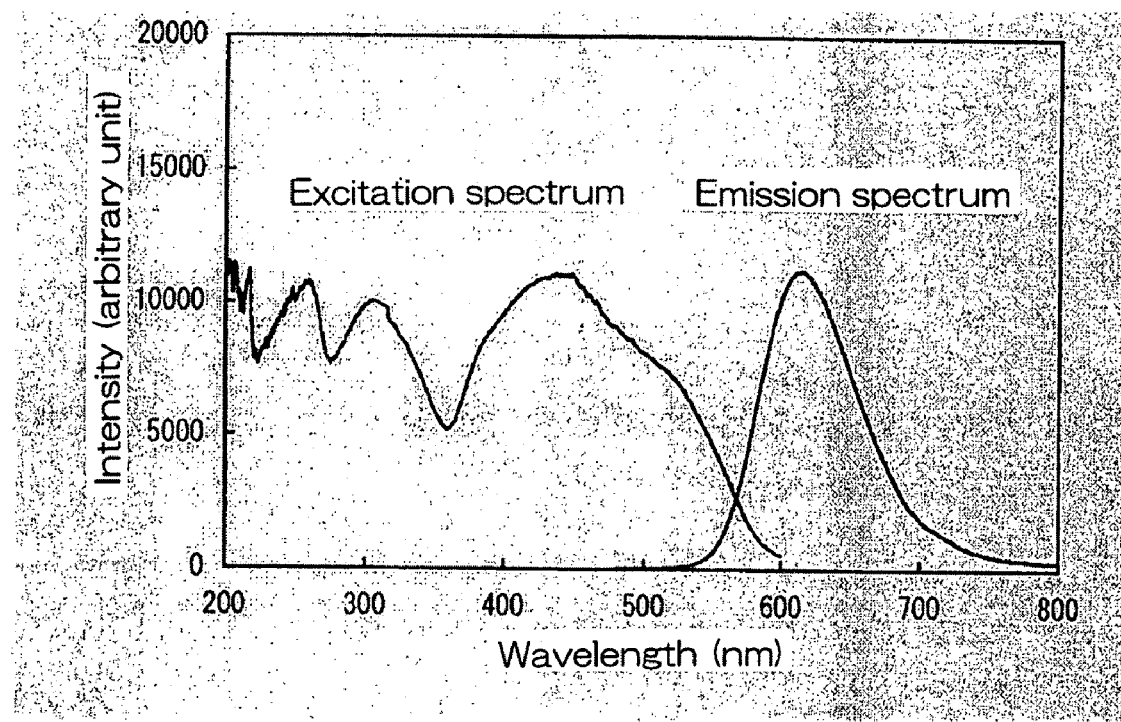
FIG. 5 is a view showing emission and excitation spectra of a phosphor (Example 2)

Next, the synthesized compound was pulverized by means of an agate mortar and then measurement of powder X-ray diffraction was conducted using Kα line of Cu. As a result, unreacted $Si_3N_4$ or SrO was not found, and it was confirmed to be constituted by the following three phases (1) solid solution having the same crystal structure as $Sr_2Si_5N_8$ (2) α-type $Sr_2SiO_4$ (3) β-type $Sr_2SiO_4$. As shown by an emission spectrum and excitation spectrum (FIG. 5), high-luminance red phosphor was obtained.

Next, in order to apply heart treatment to the synthesized compound, the compound was placed in the crucible made of boron nitride and the crucible was set in a graphite resistive heating-type electric furnace. The heating treatment was conducted as follows: the baking atmosphere was first vacuumed by a diffusion pump, heated from room temperature to 800° C. at a rate of 500° C. per hour, and pressurized to 0.5 MPa by introducing nitrogen having a purity of 99.999% by volume at 800° C., and the temperature was elevated to 1600° C. at a rate of 500° C. per hour and held at 1600° C. for 2 hours. The obtained product maintained its filling state of the powder and a dense portion was not founded.

Figure 6:
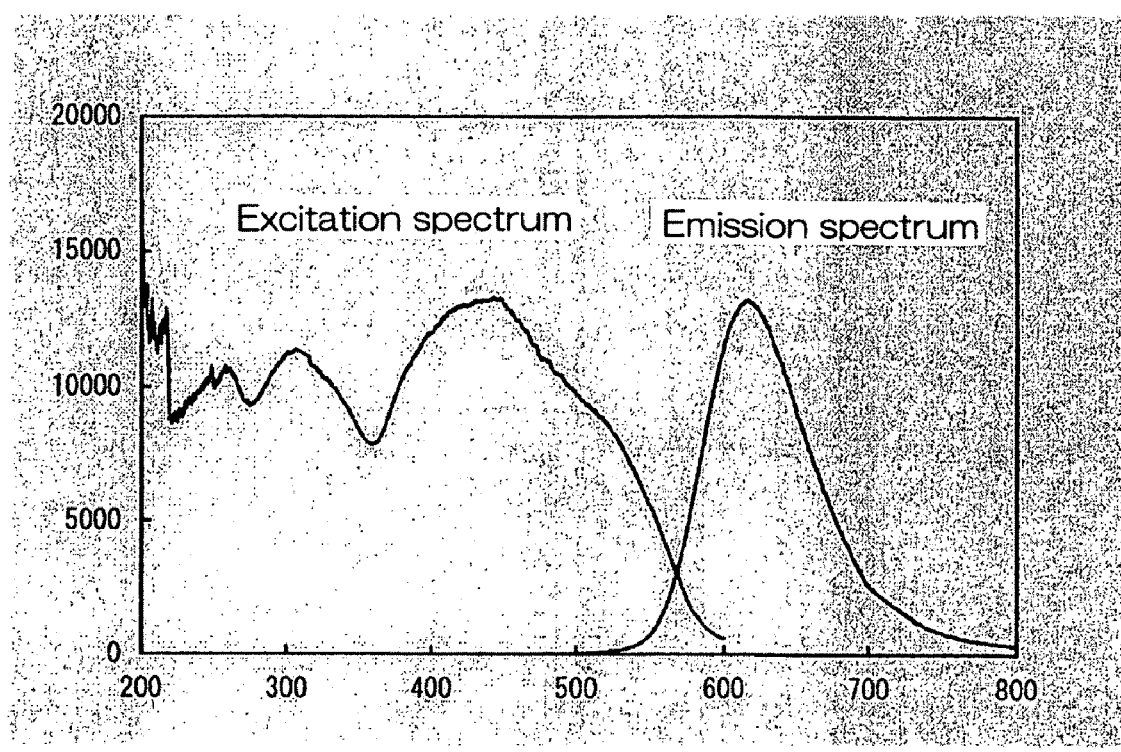
FIG. 6 is a view showing emission and excitation spectra of a phosphor (after heat treatment in Example 2)

Next, the synthesized compound was pulverized by means of an agate mortar and then measurement of powder X-ray diffraction was conducted using Kα line of Cu. As a result, unreacted $Si_3N_4$ or SrO was not found, and it was confirmed to be constituted by the following three phases (1) solid solution having the same crystal structure as $Sr_2Si_5N_8$ (2) α-type $Sr_2SiO_4$ (3) β-type $Sr_2SiO_4$. As shown by an emission spectrum and excitation spectrum (FIG. 6), emission intensity was increased by heat treatment.

Comparative Example 3

In order to synthesize a compound represented by the composition formula: $Sr_2Si_5N_8:Eu^{2+}$, the silicon nitride powder having an average particle size of 0.5 µm, an oxygen content of 0.93% by weight, and an α-type content of 92%, the strontium nitride powder, and the europium nitride powder, were weighed so as to be 54.34% by weight, 45.08% by weight, and 0.58% by weight, respectively, followed by mixing, drying, and baking in a manner similar to the Example 1. After baking, the resulting baked product was roughly pulverized and then was pulverized by hand using a crucible and mortar made of silicon nitride sintered compact.

Next, the synthesized compound was pulverized by means of an agate mortar and then measurement of powder X-ray diffraction was conducted using Kα line of Cu. As a result, unreacted $Si_3N_4$ or $Sr_3N_2$ was not found, and it was confirmed to be constituted by a single phase of $Sr_2Si_5N_8$.

Figure 7:
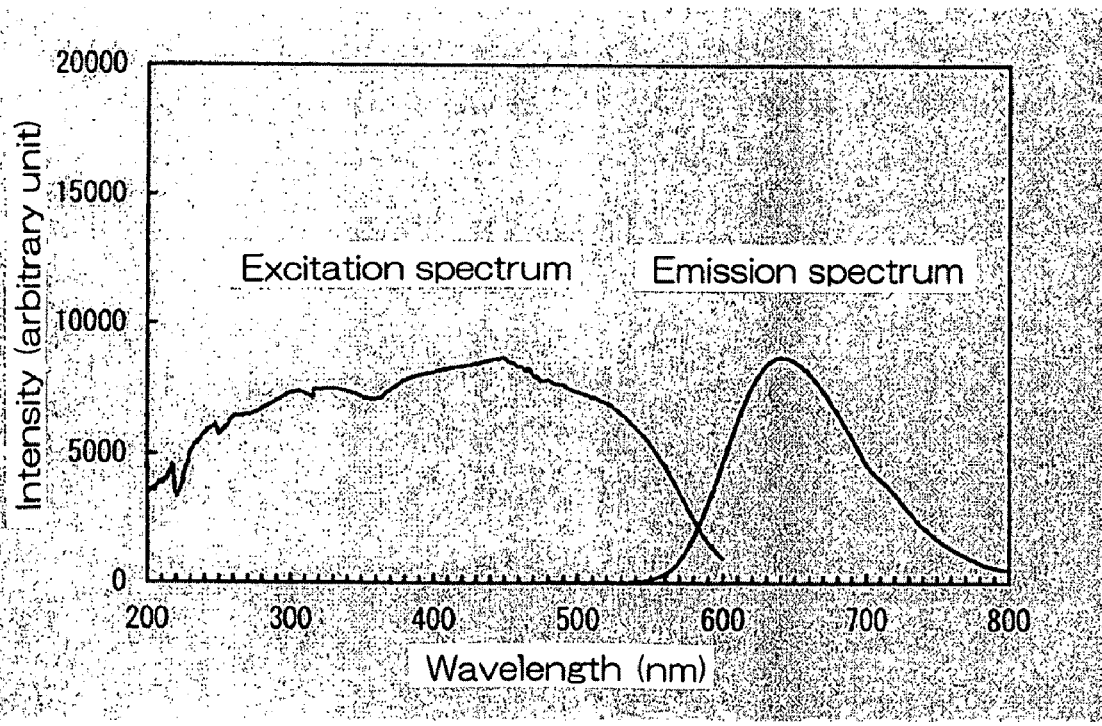
FIG. 7 is a view showing emission and excited spectra of a phosphor (Comparative Example 3)
Figure 8:
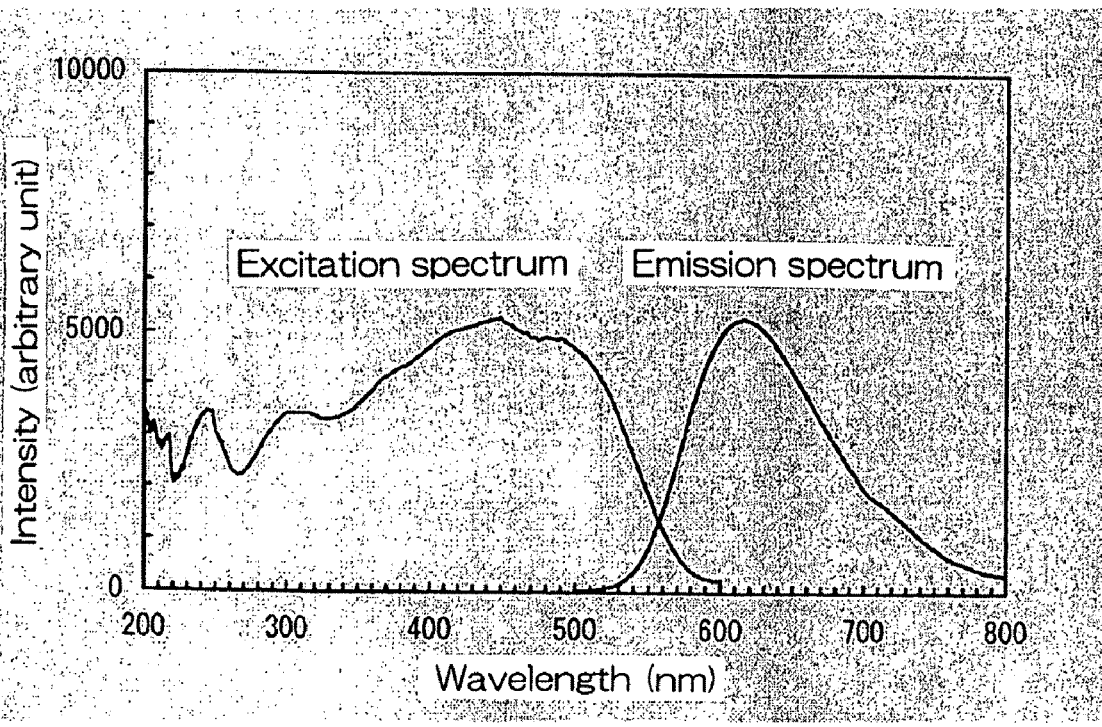
FIG. 8 is a view showing emission and excited spectra of a phosphor (Example 4)
Figure 9:
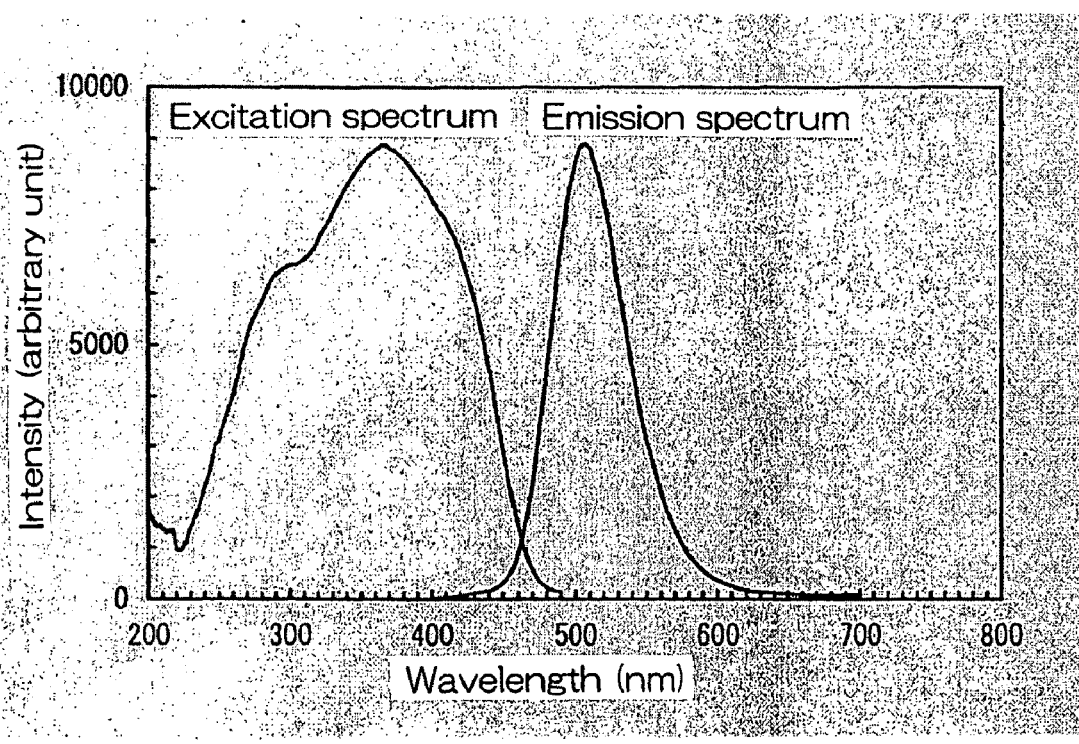
FIG. 9 is a view showing emission and excited spectra of a phosphor (Example 5)
Figure 10:
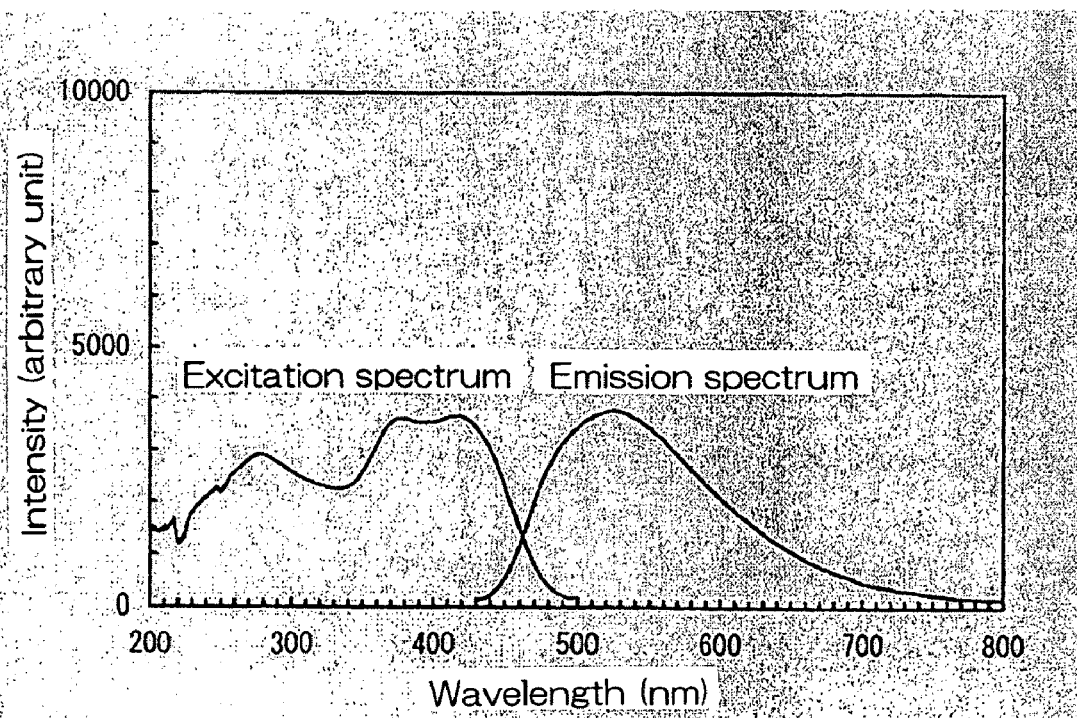
FIG. 10 is a view showing emission and excited spectra of a phosphor (Example 6)
Figure 11:
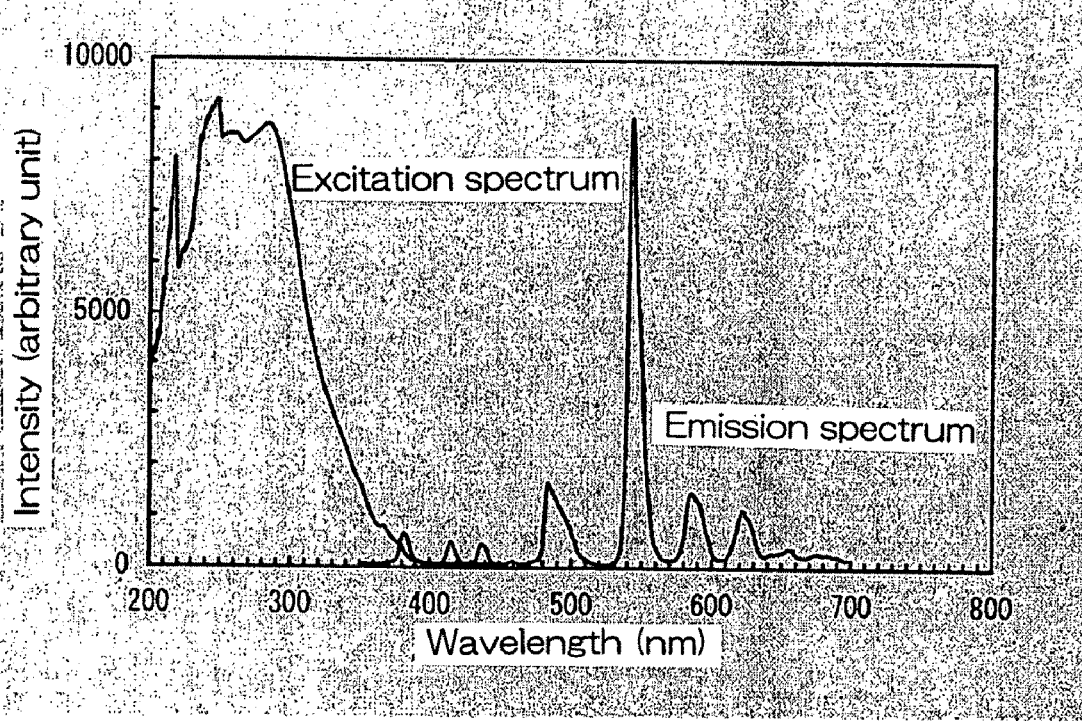
FIG. 11 is a view showing emission and excited spectra of a phosphor (Example 7)
Figure 12:
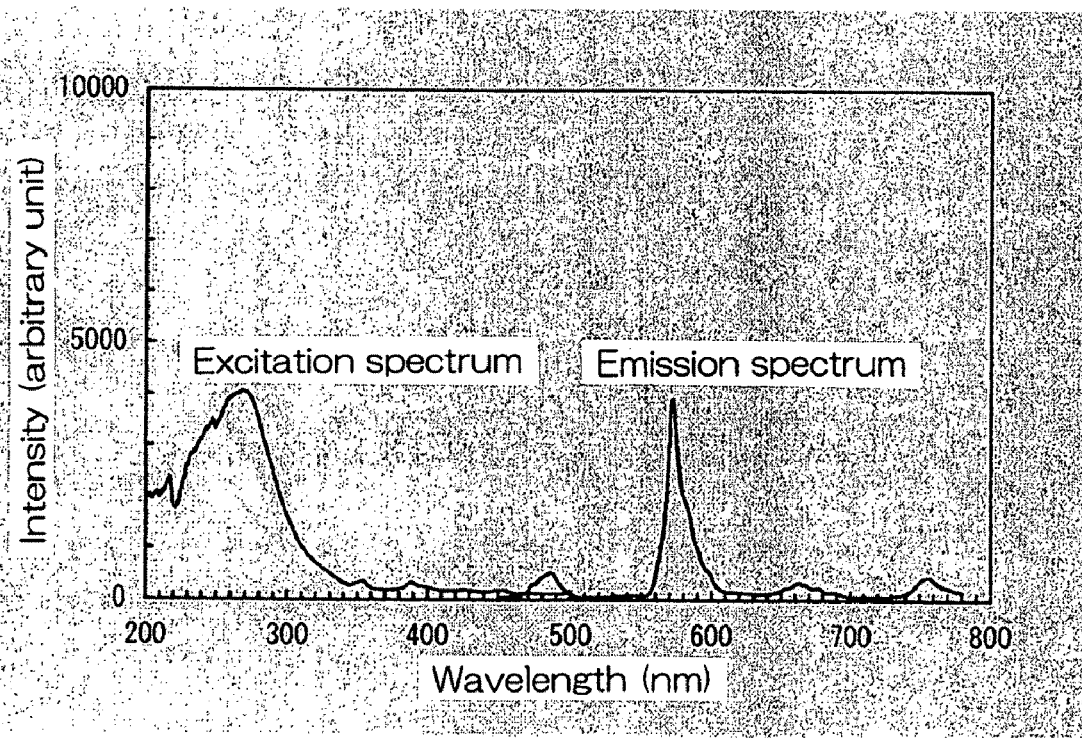
FIG. 12 is a view showing emission and excited spectra of a phosphor (Example 8)
Figure 13:
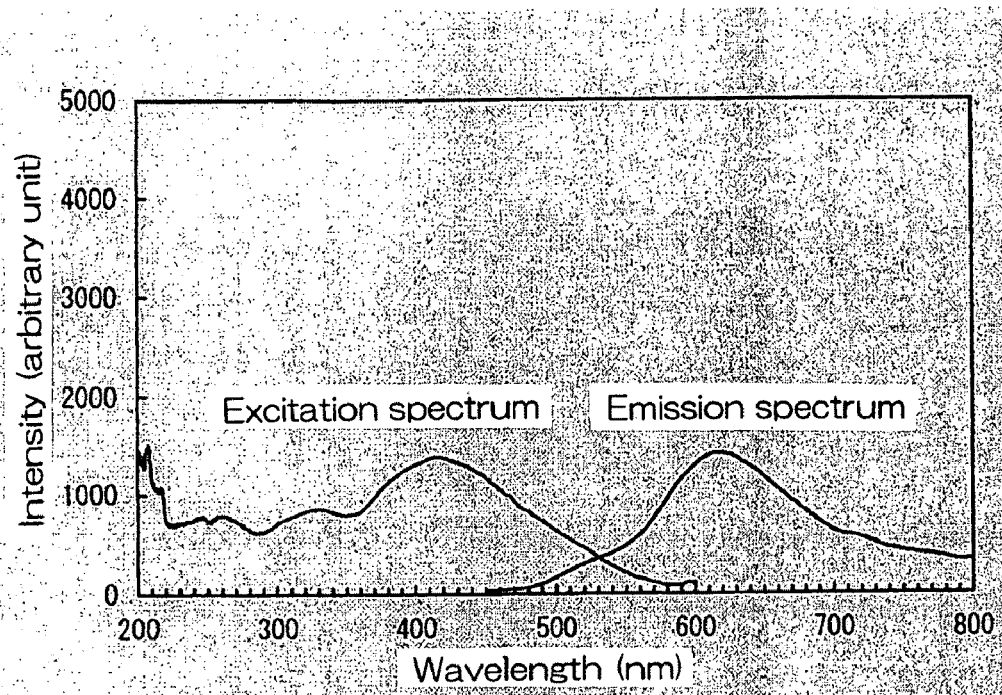
FIG. 13 is a view showing emission and excited spectra of a phosphor (Example 9)

As shown by an emission spectrum and excitation spectrum (FIG. 7), emission intensity was lower than that of the phosphor of the present invention and emission peak existed at a long wavelength.

Example 4

The silicon nitride powder, the calcium oxide powder, and the europium oxide powder, were weighed so as to be 54.53% by weight, 42.73% by weight, and 2.74% by weight, respectively, followed by mixing, drying, baking, and pulverization in a manner similar to the Example 1 to synthesize $Eu_{0.0036364}Ca_{0.178182}Si_{0.272727}O_{0.181818}N_{0.363636}$ ($Ca_{3-y}Si_3O_3N_4:Eu_y^{2+}$, y=0.04)

Example 5

The silicon nitride powder, the barium oxide powder, and the europium oxide powder, were weighed so as to be 31.33% by weight, 67.1% by weight, and 1.57% by weight, respectively, followed by mixing, drying, baking, and pulverization in a manner similar to the Example 1 to synthesize $Eu_{0.0036364}Ba_{0.178182}Si_{0.272727}O_{0.181818}N_{0.363636}$ ($Ba_{3-y}Si_3O_3N_4:Eu_y^{2+}$, y=0.04).

Example 6

The silicon nitride powder, the strontium oxide powder, and the cerium oxide ($CeO_2$) powder, were weighed so as to be 39.81% by weight, 58.23% by weight, and 1.95% by weight, respectively, followed by mixing, drying, baking, and pulverization in a manner similar to the Example 1 to synthesize $Ce_{0.0036166}Sr_{0.179024}Si_{0.271248}O_{0.184448}N_{0.361664}$.

Example 7

The silicon nitride powder, the strontium oxide powder, and the terbium oxide ($Tb_4O_7$) powder, were weighed so as to be 39.75% by weight, 58.14% by weight, and 2.12% by weight, respectively, followed by mixing, drying, baking, and pulverization in a manner similar to the Example 1 to synthesize $Tb_{0.0036166}Sr_{0.179024}Si_{0.271248}O_{0.184448}N_{0.361664}$.

Example 8

The silicon nitride powder, the strontium oxide powder, and the dysprosium oxide ($Dy_2O_3$) powder, were weighed so as to be 39.75% by weight, 58.14% by weight, and 2.11% by weight, respectively, followed by mixing, drying, baking, and pulverization in a manner similar to the Example 1 to synthesize $Dy_{0.0036166}Sr_{0.179024}Si_{0.271248}O_{0.184448}N_{0.361664}$.

Example 9

The silicon nitride powder, the strontium oxide powder, and the ytterbium oxide ($Yb_2O_3$) powder, were weighed so as to be 39.7% by weight, 58.07% by weight, and 2.23% by weight, respectively, followed by mixing, drying, baking, and pulverization in a manner similar to the Example 1 to synthesize $Yb_{0.0036166}Sr_{0.179024}Si_{0.271248}O_{0.184448}N_{0.361664}$.

The respective products synthesized in the Examples 4 to 9 were pulverized by means of an agate mortar and then measurement of powder X-ray diffraction was conducted using Kα line of Cu. As a result, unreacted $Si_3N_4$ or AO was not found, but a solid solution having the same crystal structure as $A_2Si_5N_8$ and oxide containing A were confirmed. As shown by emission spectra and excitation spectra (FIGS. 8 to 13), high-luminance phosphor was obtained. Light emission color is red in Example 4, light emission color is green in Examples 5, 6, and 7, light emission color is orange in Example 8, and light emission color is red in Example 9.

The following will explain the lighting apparatus using a phosphor comprising the nitride of the present invention.

Example 10

A green phosphor (β-sialon:Eu) used for a lighting apparatus is synthesized.

Figure 14:
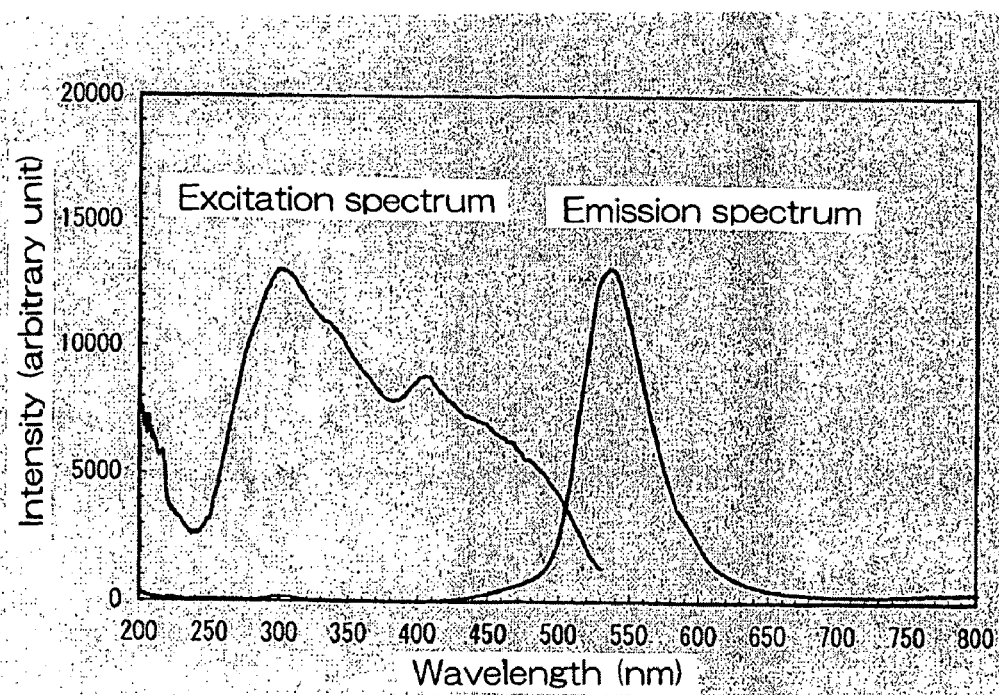
FIG. 14 is a view showing emission and excited spectra of β-sialon:Eu green phosphor.

In order to obtain a compound represented by the composition formula: $Eu_{0.00296}Si_{0.41395}Al_{0.1334}O_{0.00444}N_{0.56528}$, the silicon nitride powder, the aluminum nitride powder, and the europium oxide powder, were weighed so as to be 94.77% by weight, 2.68% by weight, and 2.556% by weight, respectively, followed by mixing. The resultant mixture was placed in a crucible made of boron nitride and baked at a temperature range of 1900° C. in a nitrogen gas atmosphere of 1 MPa for 8 hours. The obtained powder is an inorganic compound in which Eu is dissolved in β-sialon, which is a green phosphor as shown by excitation/emission spectra of FIG. 14.

Figure 15:
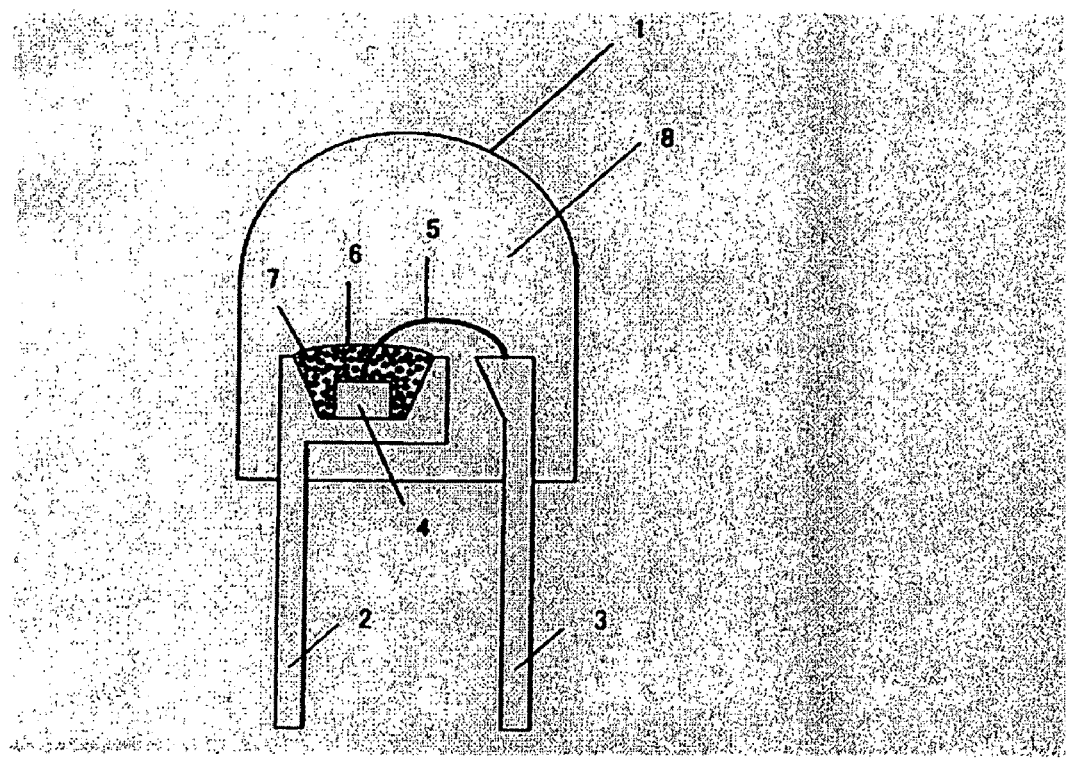
FIG. 15 is a view showing an outline of a lighting apparatus (LED lighting apparatus) according to the present invention.

So-called a bullet-type white LED lamp (1) shown in FIG. 15 was produced. As shown in FIG. 15, LED lamp has two lead wires (2, 3). The lead wire (2) has a concaved portion in which a blue LED element (4) is placed. The lower electrode of the blue LED element (4) is electrically connected to the bottom surface of the concaved portion by a conductive paste, and upper electrode thereof is electrically connected to the lead wire (3) by a gold thin wire (5). A phosphor in this example is a mixture of a first phosphor and second phosphor. The first phosphor is β-sialon:Eu synthesized in this Example. The second phosphor is the phosphor synthesized in the Example 2. The mixture (7) of the first and second phosphors are dispersed in a resin and disposed near the LED element (4). A first resin (6) in which the mixed phosphor is dispersed is transparent and covers the entire blue LED element (4). The leading end of the lead wire including the concave portion, blue LED element, and first resin in which the phosphor is dispersed are sealed by a transparent second resin (8). The transparent second resin (8) has substantially a columnar shape as a whole. The leading end of the second resin (8) is formed into a lens-shaped curved surface and, therefore, this LED lamp is called "bullet-type".

Figure 16:
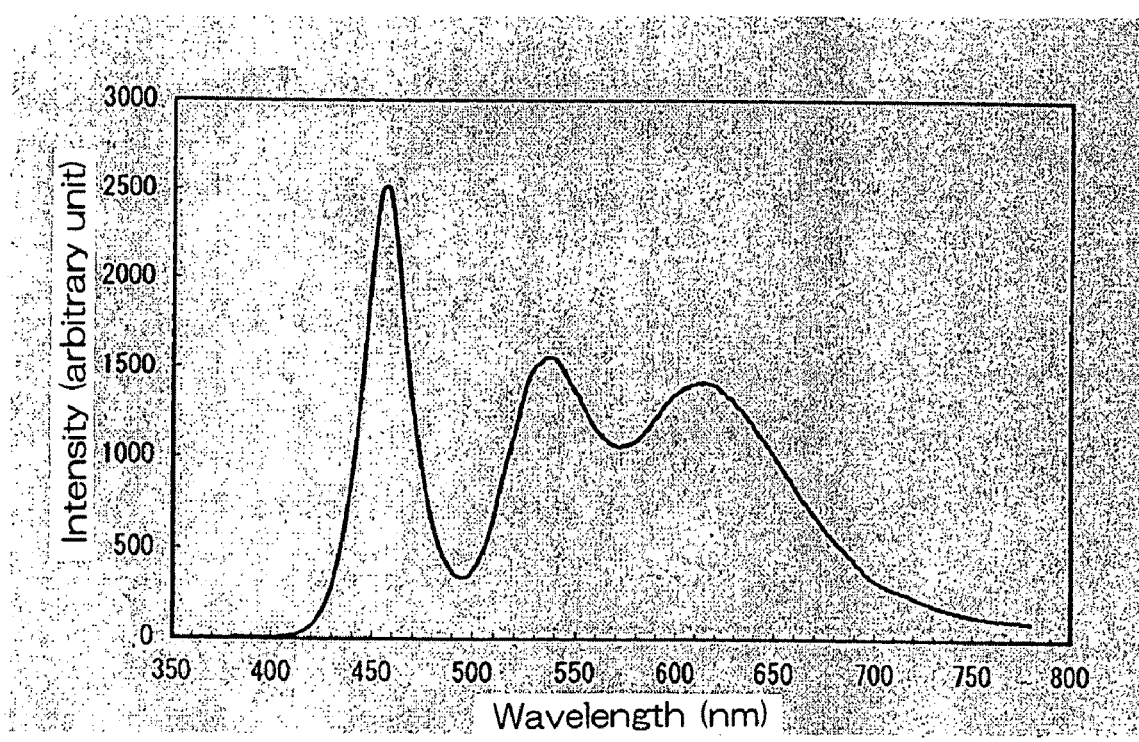
FIG. 16 is a view showing an emission spectrum of a lighting apparatus.

In the present example, the first and second phosphors are mixed in a mixing ratio of 5:1, and the powder thus mixed is mixed in an epoxy resin at a concentration of 35% by weight. Then, the appropriate amount of the resultant mixture is dropped using a dispenser, whereby the first resin (6) in which the mixed phosphor (7) is dispersed is formed. Obtained chromaticity is x=0.33 and y=0.33, which exhibits a white light. FIG. 16 shows an emission spectrum of the white LED diode.

Next, a production procedure of the bullet-type white LED of this Example will be described. First, the blue LED element (4) is die-bonded in the concave portion for element placement formed by the lead wire (2) using a conductive paste to allow the lead wire and lower electrode of the blue LED element (4) to be connected electrically to each other and allows the blue LED element (4) to be fixed on the concave portion. Then, the upper electrode of the blue LED element (4) and lead wire (3) are wire-boded to each other for electrical connection. The first phosphor powder (green) and second phosphor powder (red) are previously mixed in a mixing ratio of 5:2, and the mixed phosphor powder is mixed in an epoxy resin at a concentration of 35% by weight. The appropriate amount of the resultant mixture is coated on the concave portion so as to cover the blue LED element by a dispenser for hardening to form the first resin (6). Finally, a casting method is used to entirely seal the leading end of the lead wire including the concave portion, blue LED element, the first resin in which the phosphor is dispersed by a second resin. Although the same epoxy resin is used as the first and second resins in this Example, another resin such as silicon resin or a transparent resin such as glass may be used. It is preferable to select a material less susceptible to deterioration due to ultraviolet light.

Example 11

A chip type white LED lamp for mounting on substrate (19) was produced.

Figure 17:
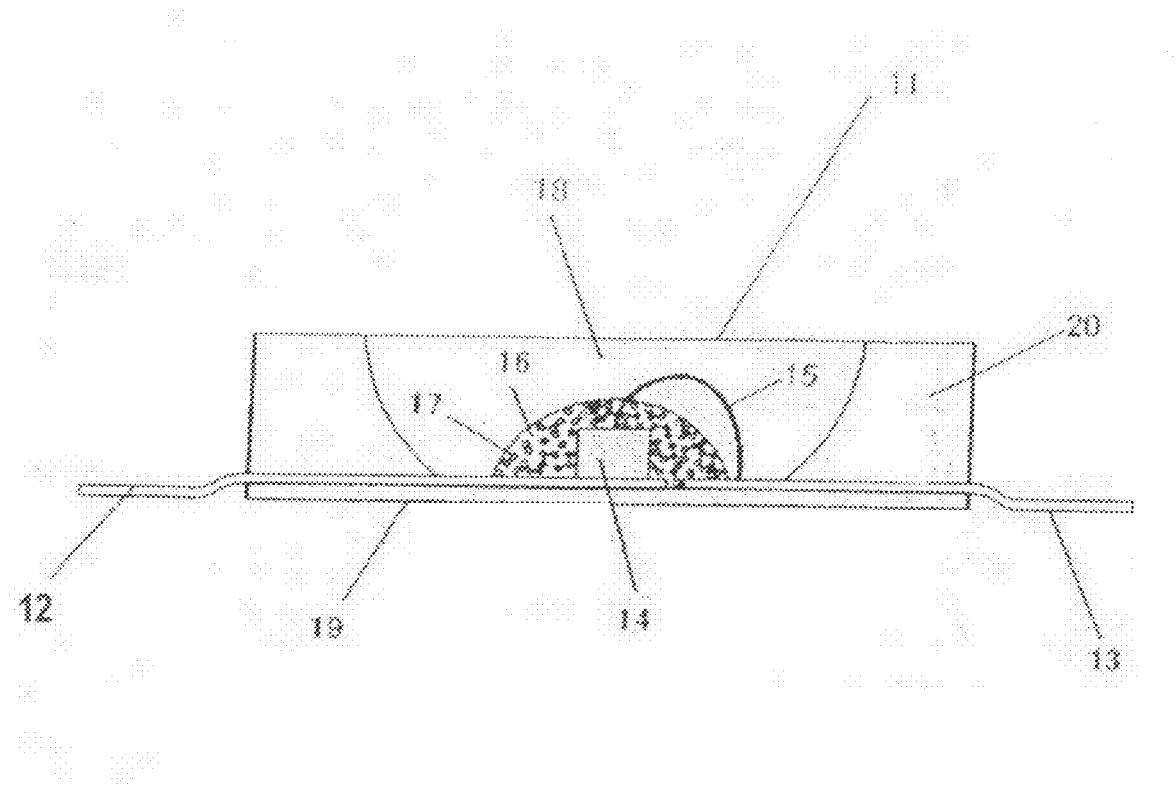
FIG. 17 is a view showing an outline of a lighting apparatus (LED lighting apparatus) according to the present invention.

A configuration of the white LED lamp (11) is shown in FIG. 17. Two lead wires (12, 13) are fixed to a white alumina ceramic substrate (19) having a high reflectivity against visible light. One ends of the wires are located at substantially the center portion of the substrate. The other ends of the wires, which are extended outside the substrate, serve as electrodes to be soldered to an electric board. The blue LED element (14) is placed and fixed to the one end of the lead wire (12) at the center position of the substrate. The lower electrode of the blue LED element (14) and lead wire disposed under the blue LED element (14) are electrically connected to each other by a conductive paste, and upper electrode thereof and lead wire (13) are electrically connected to each other by a gold thin wire (15).

A phosphor (17) in which first phosphor and second phosphor are mixed is dispersed in a resin and disposed near the LED element. A first resin (16) in which the phosphor is dispersed is transparent and covers the entire blue LED element (14). A wall surface member (20) formed into a shape having a hole at its center is fixed on the ceramic substrate. The wall surface member (20) serves as a hole for placing the blue LED element (14) and first resin (16) in which the phosphor (17) is dispersed, as shown in FIG. 17. The portion of the wall surface member (20) that faces the center portion forms a slope. This slope is a reflecting surface for directing the light forward. The curved shape of the slope is determined in consideration of the reflecting direction of the light. In addition, at least the face serving as the reflecting surface is formed of a material having a high reflectivity of visible light and having a color of white or metallic luster. In this Example, the wall surface member (20) is made of a white silicone resin. The hole of the center portion of the wall surface member forms a concave portion as the final shape of the chip-type LED lamp, in which a transparent second resin (18) is filled so as to entirely cover the blue LED element (14) and first resin (16) in which the phosphor (17) is dispersed. In this Example, the same epoxy resin is used as the first and second resins (16, 18). The mixing ratio of the first and second phosphors, achieved chromaticity, and the like are substantially the same as those in the Example 10. The production procedure is also substantially the same as that of the Example 10 except that the lead wires (12, 13) and wall surface member (20) are fixed to the alumina ceramics substrate (19).

Example 12

A lighting apparatus having a configuration different from that of the above will be described. In the lighting apparatus shown in FIG. 15, a blue LED of 450 nm is used as a light emitting element, which is covered with a resin layer in which the phosphor of the Example 1 of the present invention and a yellow phosphor of Ca-α-sialon:Eu having a composition represented by $Ca_{0.75}Eu_{0.25}Si_{8.625}Al_{3.375}O_{1.125}N_{14.875}$ are dispersed. When a current is applied to a conductive terminal, the LED emits a light of 450 nm, by which the yellow phosphor and red phosphor are excited to emit yellow light and red light. As a result, the light of the LED, yellow light, and red light are mixed to emit a warm white light.

Example 13

A lighting apparatus in which compositions of the phosphors different from those of the above will be described. In the lighting apparatus shown in FIG. 15, a ultraviolet LED of 380 nm is used as a light emitting element, which is covered with a resin layer in which the phosphor of the Example 1 of the present invention, a blue phosphor ($BaMgAl_{10}O_{17}$:Eu), and a green phosphor ($BaMgAl_{10}O_{17}$:Eu, Mn) are dispersed. When a current is applied to a conductive terminal, the LED emits a light of 380 nm, by which the red phosphor, green phosphor, and blue phosphor are excited to emit red light, green light, and blue light. As a result, these lights are mixed to emit a white light.

The following will explain a design example of an image display unit using the phosphor of the present invention.

Example 14

Figure 18:
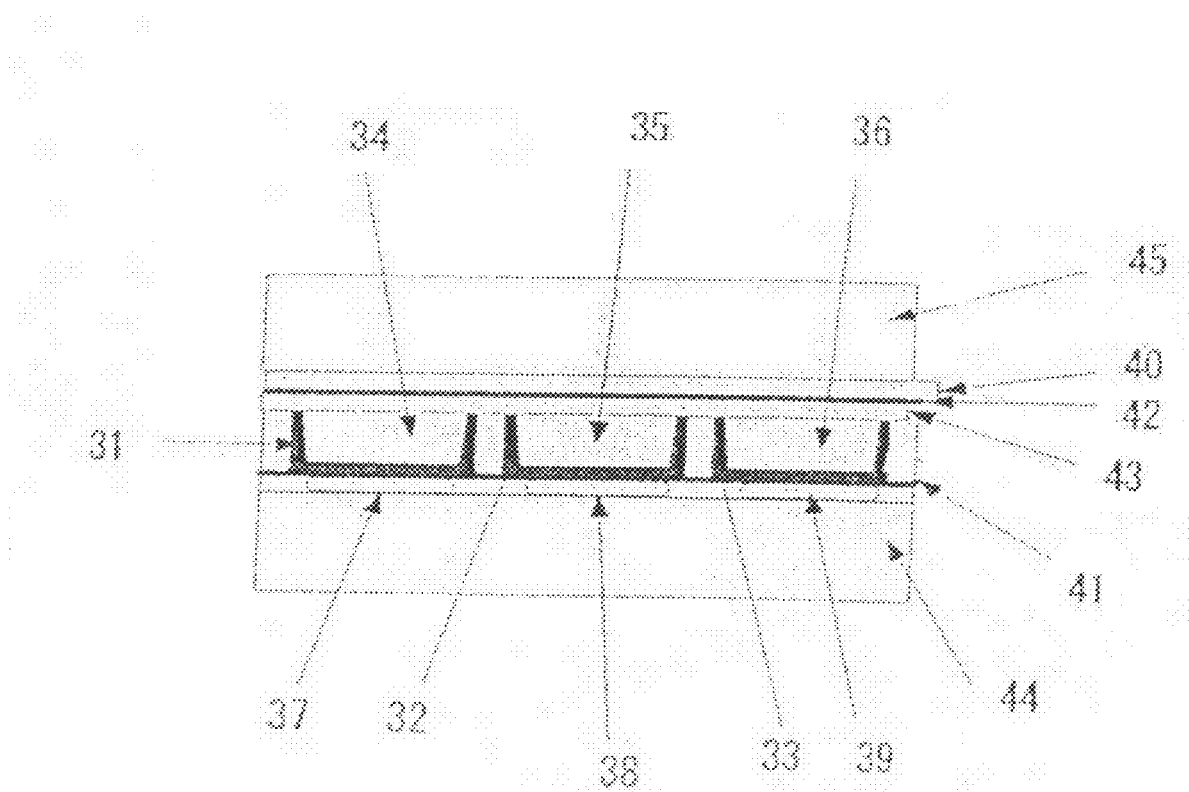
FIG. 18 is a view showing an outline of an image display unit (plasma display panel) according to the present invention.

FIG. 18 is a principle schematic view of a plasma display panel as an image display unit. The red phosphor of Example 1 of the present invention, a green phosphor ($Zn_2SiO_4$:Mn), and a blue phosphor ($BaMgAl_{10}O_{17}$:Eu) are applied on the inner surface of cells 34, 35, and 36, respectively. When electric current is passed through electrodes 37, 38, 39, and 40, a vacuum ultraviolet ray is generated in the cells by Xe discharge and thereby the phosphors are excited to emit red, green, and blue visible lights. The lights are observed from the outside through the protective layer 43, the dielectric layer 42, and the glass substrate 45, whereby the unit functions as an image display.

INDUSTRIAL APPLICABILITY

The nitride phosphor of the present invention exhibits emission at a longer wavelength as compared with conventional sialon and oxynitride phosphors and is excellent as a red phosphor. Furthermore, since luminance decrease of the phosphor is small when it is exposed to an excitation source, it is a nitride phosphor suitably used for VFD, FED, PDP, CRT, white LED, and the like. From hereon, it is expected that the phosphor is widely utilized in material design in various display units and thus contributes to development of industry.

The invention claimed is:

1. A production method of a phosphor comprising:
mixing raw material powders of silicon nitride, M element-containing inorganic substance having oxide of M element, and A element-containing inorganic substance as starting materials (wherein the M Element is one or more elements selected from the group consisting of Mn, Ce, Pr, Nd, Sm, Eu, Tb, Dy, Ho, Er, Tm, and Yb; the A Element is one or more elements selected from the group consisting of Mg, Ca, Sr, and Ba; the oxide of M element is on $M_2O_3$ basis; and the A element-containing inorganic substance is on AO basis) in a mixing ratio represented by $fSi_3N_4$-$gM_2O_3$-$hAO$, in which $$f+g+h=1$$

$$0.00001 \leq g \leq 0.03 \qquad (6)$$

$$0.4 \leq h \leq 0.8 \qquad (7)$$

are satisfied, so as to obtain a raw material mixture; and
baking the raw material mixture at a baking temperature in a range of 1200° C. to 2200° C. in a nitrogen atmosphere so as to produce the phosphor as an inorganic composition containing the at least M Element, A Element, silicon, oxygen, and nitrogen, and including at least an inorganic crystal having the same crystal structure as that of $A_2Si_5N_8$ and an A element-containing crystal which is silicate containing A, Si, and O other than the inorganic crystal having the same crystal structure as that of $A_2Si_5N_8$.

2. The phosphor production method according to claim 1, wherein the m element-containing inorganic substance is a mixture of one or more compounds selected from the group consisting of metal, silicide, oxide, carbonate, nitride, fluoride, and chloride or oxynitride of M element, and the A element-containing inorganic substance is a mixture of one or more compounds selected from the group consisting of metal, silicide, oxide, carbonate, nitride, fluoride, and chloride or oxynitride of A element.

3. The phosphor production method according to claim 2, wherein the M element-containing inorganic substance is the oxide of M element, and the A element-containing inorganic substance is the oxide of A element.

4. The phosphor production method according to claim 1, wherein a flux compound for generating a liquid phase at the baking temperature is added to the raw material mixture.

5. The phosphor production method according to claim 1, wherein the raw material mixture in the form of powder or powder aggregate is filled in a vessel with a relative bulk density maintained at 40% or less before baking.

6. The phosphor production method according to claim 1, wherein an average particle size of synthesized phosphor powder is controlled to 50 nm to 50 μm by one or more methods selected from pulverization, classification, and acidizing.

7. The phosphor production method according to claim 1, wherein the phosphor powder after baking, phosphor powder after pulverization, or phosphor powder after particle size control, is subjected to heat treatment at a temperature of not lower than 1000° C. but not higher than the baking temperature.

8. The phosphor production method according to claim 1, wherein the produced phosphor after baking is washed by water or acid aqueous solvent so as to reduce a contained amount of a glass phase, second phase, flux component phase, or impurity phase.

* * * * *